(12) United States Patent
Aluc et al.

(10) Patent No.: US 12,265,535 B1
(45) Date of Patent: Apr. 1, 2025

(54) DATASET SUMMARY METADATA PROVIDING IMPROVED QUERY PERFORMANCE

(71) Applicant: SAP SE, Walldorf (DE)

(72) Inventors: Gunes Aluc, Waterloo (CA); Bojana Bislimovska, Waterloo (CA)

(73) Assignee: SAP SE, Walldorf (DE)

( * ) Notice: Subject to any disclaimer, the term of this patent is extended or adjusted under 35 U.S.C. 154(b) by 0 days.

(21) Appl. No.: 18/376,369

(22) Filed: Oct. 3, 2023

(51) Int. Cl.
*G06F 16/901* (2019.01)
*G06F 16/13* (2019.01)
*G06F 16/21* (2019.01)
*G06F 16/2453* (2019.01)
*G06F 16/28* (2019.01)
*G06F 16/2457* (2019.01)

(52) U.S. Cl.
CPC ...... *G06F 16/24537* (2019.01); *G06F 16/284* (2019.01); *G06F 16/24573* (2019.01)

(58) Field of Classification Search
CPC ............ G06F 16/24537; G06F 16/284; G06F 16/24573
USPC ........................................................ 707/722
See application file for complete search history.

(56) References Cited

U.S. PATENT DOCUMENTS

| | | | | |
|---|---|---|---|---|
| 7,765,221 B2 * | 7/2010 | Zimmerer | ........... | G06F 16/2477 708/211 |
| 10,267,649 B2 * | 4/2019 | Kim | ........................ | G01C 25/00 |
| 11,727,008 B1 * | 8/2023 | Levy | ................. | G06F 16/24578 707/705 |
| 2003/0002184 A1 * | 1/2003 | Hayami | ................. | H03M 5/145 360/29 |
| 2007/0165035 A1 * | 7/2007 | Duluk | ..................... | G06T 15/20 345/506 |
| 2008/0059492 A1 * | 3/2008 | Tarin | ..................... | G06F 16/221 |
| 2008/0197884 A1 * | 8/2008 | Ickler | ....................... | H04R 3/02 326/104 |
| 2009/0254971 A1 * | 10/2009 | Herz | ...................... | G06Q 10/10 726/1 |
| 2011/0131170 A1 * | 6/2011 | Golab | ..................... | G06N 5/00 706/54 |

(Continued)

OTHER PUBLICATIONS

OraDBAdmGuideRel1May 22, 2020: Oracle® Database Database Administrator's Guide 12c Release 2 (12.2) E85760-09 (Year: 2001).*

(Continued)

*Primary Examiner* — Kuen S Lu
(74) *Attorney, Agent, or Firm* — Klarquist Sparkman, LLP

(57) ABSTRACT

The present disclosure provides techniques and solutions for determining whether a particular value is in a dataset using summary information. A sorted set of unique values is received. The sorted set of unique values includes gaps between at least certain values. The gaps are determined, and the set of unique values is represented as a gap filter. The gap filter includes a starting value of the set of unique values, a set of gap lengths, and identifiers indicating a number of unique values between respective gaps. The gap filter serves as summary information that can be used to determine whether a value be present in the dataset. In at least some cases, the use of the summary information may provide false positive results. The representation of the gap filter can be modified to improve its compressibility, but may increase the number of false positives produced by the gap filter.

20 Claims, 28 Drawing Sheets

(56) References Cited

U.S. PATENT DOCUMENTS

| | | | |
|---|---|---|---|
| 2014/0195542 A1* | 7/2014 | Larson | G06F 16/2228 707/741 |
| 2018/0335946 A1* | 11/2018 | Wu | G06F 16/90339 |
| 2019/0138500 A1* | 5/2019 | Sharangpani | G06F 16/283 |
| 2022/0245147 A1 | 8/2022 | Segalini et al. | |
| 2024/0202076 A1* | 6/2024 | He | G06F 11/1451 |

OTHER PUBLICATIONS

Partial European Search Report received in European Application No. 24203968.3, dated Feb. 10, 2025, 13 pages.

\* cited by examiner (1000, 1010, 1000, 1101, 1000, 1001, 0001, 1100, 1011) 604

Starting Value: 5

| Code | Value |
|---|---|
| 0XXX | N=XXX+3 |
| 1000 | 1 |
| 1001 | 4 |
| 1010 | 6 |
| 1011 | 11 |
| 1100 | 12 |
| 1101 | 20 |

608

Decoded Sequence: (1, 6, 1, 20, 1, 4,
(1, 6, 1, 20, 1, 4, (1+3)x...,
(1, 6, 1, 20, 1, 4, 4x....,
(1, 6, 1, 20, 1, 4x 12,
(1, 6, 1, 20, 1, 12, 12, 12, 12, 11) ⎬ 624

616

11 elements
=(5 + 1) + 5 = 6 + 5 elements
=6 nset elements + 5 gap elements

| Gap | 12 | ... | 18 | 23 | ... | 36 | ... | 49 | 51 | ... | 60 | 63 | 65 | ... | 68 | ... | 81 | ... | 93 | ... | 96 |
|---|---|---|---|---|---|---|---|---|---|---|---|---|---|---|---|---|---|---|---|---|---|
| nSet | 5 | | | 6 | | 12 | 1 | 20 | | | | | | 12 | 1 | | 11 | | 4 | | |

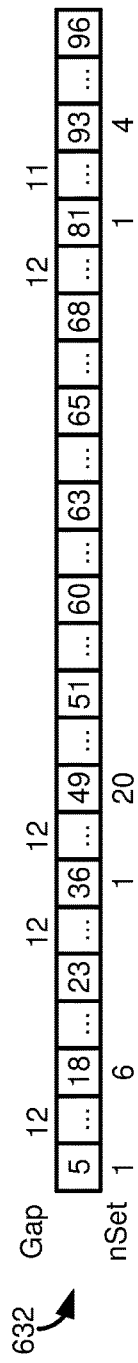

| Gap | 12 | | 12 | | 12 | | | | | | 12 | | 11 | | |
|---|---|---|---|---|---|---|---|---|---|---|---|---|---|---|---|
| | 5 | ... | 18 | ... | 23 | ... | 36 | ... | 49 | ... | 51 | ... | 60 | ... | 63 | ... | 65 | ... | 68 | ... | 81 | ... | 93 | ... | 96 |
| nSet | 1 | | 6 | | 1 | | 20 | | | | | | | | 1 | | 4 |

632

Query:
Is 4 contained by the gap filter?
Answer:
No, 4 is less than 5, which is the minimum element represented by the gap filter Query:
Is 120 contained by the gap filter?
Answer:
No, 120 is greater than 96, which is the maximum element represented by the gap filter Query:
Is 25 contained by the gap filter?
Answer:
No, 25 falls into the gap between 23 and 36 (exclusive); therefore, it is not contained by the gap filter Query:
Is 93 contained by the gap filter?
Answer:
Yes, 93 falls into the region between 93 and 96 (inclusive) that is set in the gap filter

FIG. 7A

Query:
Is 62 contained by the gap filter?

Answer:
Yes, 62 falls into the region between 49 and 68 (inclusive) that is set in the gap filter Note that this is a false positive response; as it would not have been contained by the original, uncompressed version of the gap filter:

908 ↴
{36, 18, 51, 60, 65, 67, 49, 96, 63, 5, 93, 81}  904 ↲

{3̶6̶, 18, 51, 60, 65, 67, 49, 96, 63, 5, 93, 81}  910 ↲
{36} — 912

Current Offset: 0

908 ↴
{3̶6̶, 1̶8̶, 51, 60, 65, 67, 49, 96, 63, 5, 93, 81}
{36, 18} — 912                                      924 ↲

Current Offset: 0

908 ↴
{3̶6̶, 1̶8̶, 51, 60, 65, 67, 49, 96, 63, 5, 93, 81}
{36, 118} — 912                                     928 ↲

Current Offset: 100

908 ↴
{3̶6̶, 1̶8̶, 5̶1̶, 60, 65, 67, 49, 96, 63, 5, 93, 81}
{36, 118, 51} — 912                                 932 ↲

Current Offset: 100

908 ↴
{3̶6̶, 1̶8̶, 5̶1̶, 60, 65, 67, 49, 96, 63, 5, 93, 81}
{36, 118, 151} — 912                                936 ↲

Current Offset: 100

Current Offset: 100

908⤴

{~~36~~, ~~18~~, ~~51~~, ~~60~~, 65, 67, 49, 96, 63, 5, 93, 81}          942

{36, 118, 151, 160, 165} —912

Current Offset: 100

908⤴

{~~36~~, ~~18~~, ~~51~~, ~~60~~, ~~65~~, 67, 49, 96, 63, 5, 93, 81}          944

{36, 118, 151, 160, 165, 167} —912

Current Offset: 100

908⤴

{~~36~~, ~~18~~, ~~51~~, ~~60~~, ~~65~~, ~~67~~, 49, 96, 63, 5, 93, 81}          946

{36, 118, 151, 160, 165, 167, 49} —912

Current Offset: 100

908⤴

{~~36~~, ~~18~~, ~~51~~, ~~60~~, ~~65~~, ~~67~~, 49, 96, 63, 5, 93, 81}          948

{36, 118, 151, 160, 165, 167, 249} —912

Current Offset: 200

908⤴

{~~36~~, ~~18~~, ~~51~~, ~~60~~, ~~65~~, ~~67~~, ~~49~~, ~~96~~, 63, 5, 93, 81}          952

{36, 118, 151, 160, 165, 167, 249, 296} —912

Current Offset: 200

Current Offset: 300

908↘                                                            956
　{~~36~~, ~~18~~, ~~51~~, ~~60~~, ~~65~~, ~~67~~, ~~49~~, ~~96~~, ~~63~~, 5, 93, 81}  ◂┘
                                                           912
　{36, 118, 151, 160, 165, 167, 249, 296, 363, 405} ─┘

Current Offset: 400

908↘                                                            960
　{~~36~~, ~~18~~, ~~51~~, ~~60~~, ~~65~~, ~~67~~, ~~49~~, ~~96~~, ~~63~~, 5, 93, 81}  ◂┘
                                                                   912
　{36, 118, 151, 160, 165, 167, 249, 296, 363, 405, 493} ─┘

Current Offset: 400

908↘                                                            964
　{~~36~~, ~~18~~, ~~51~~, ~~60~~, ~~65~~, ~~67~~, ~~49~~, ~~96~~, ~~63~~, 5, 93, ~~81~~}  ◂┘
                                                                       912
　{36, 118, 151, 160, 165, 167, 249, 296, 363, 405, 493, 581} ─┘

Current Offset: 500

970
　{36, 118, 151, 160, 165, 167, 249, 296, 363, 405, 493, 581} ◂┘

Construct the gap filter over the lazily sorted sequence
To determine if a value 0 ≤ x ≤ 99 is part of the gap filter
Check if any one of {x, x+100, x+200, x+300, x+400, x+500} is part of the gap filter

1108a
    ↳Output Stream #1: {}     1112
1108b—Output Stream #2: {}
1108c—Output Stream #3: {}
    ⌐Output Stream #4: {}
1108d Current Offset: 0

⌒1104
{3̶6̶, 18, 51, 60, 65, 67, 49, 96, 63, 5, 93, 81}

1108a
    ↳Output Stream #1: {36}
1108b—Output Stream #2: {}     1114
1108c—Output Stream #3: {}
    ⌐Output Stream #4: {}
1108d Current Offset: 0

⌒1104
{3̶6̶, 1̶8̶, 51, 60, 65, 67, 49, 96, 63, 5, 93, 81}

1108a
    ↳Output Stream #1: {36}     1116
1108b—Output Stream #2: {18}
1108c—Output Stream #3: {}
    ⌐Output Stream #4: {}
1108d Current Offset: 0

⌒1104
{3̶6̶, 1̶8̶, 5̶1̶, 60, 65, 67, 49, 96, 63, 5, 93, 81}

1108a
    ↳Output Stream #1: {36, 51}    1118
1108b—Output Stream #2: {18}
1108c—Output Stream #3: {}
    ⌐Output Stream #4: {}
1108d Current Offset: 0

1108a — Output Stream #1: {36, 51, 60}    1120
1108b — Output Stream #2: {18}
1108c — Output Stream #3: {}
1108d — Output Stream #4: {}

Current Offset: 0

~1104
{3̶6̶, 1̶8̶, 5̶1̶, 6̶0̶, 6̶5̶, 67, 49, 96, 63, 5, 93, 81}

1108a — Output Stream #1: {36, 51, 60, 65}    1122
1108b — Output Stream #2: {18}
1108c — Output Stream #3: {}
1108d — Output Stream #4: {}

Current Offset: 0

~1104
{3̶6̶, 1̶8̶, 5̶1̶, 6̶0̶, 6̶5̶, 6̶7̶, 49, 96, 63, 5, 93, 81}

1108a — Output Stream #1: {36, 51, 60, 65, 67}    1124
1108b — Output Stream #2: {18}
1108c — Output Stream #3: {}
1108d — Output Stream #4: {}

Current Offset: 0

~1104
{3̶6̶, 1̶8̶, 5̶1̶, 6̶0̶, 6̶5̶, 6̶7̶, 49, 96, 63, 5, 93, 81}

1108a — Output Stream #1: {36, 51, 60, 65, 67}    1126
1108b — Output Stream #2: {18, 49}
1108c — Output Stream #3: {}
1108d — Output Stream #4: {}

Current Offset: 0

1108a
    ↘ Output Stream #1: {36, 51, 60, 65, 67, 96}    1128
1108b ↘ Output Stream #2: {18, 49}
1108c ↗ Output Stream #3: {}
    ┌ Output Stream #4: {}
1108d Current Offset: 0

┌─1104
{~~36~~, ~~18~~, ~~51~~, ~~60~~, ~~65~~, ~~67~~, ~~49~~, ~~96~~, ~~63~~, 5, 93, 81}
                                                 1130
1108a
  ↘ Output Stream #1: {36, 51, 60, 65, 67, 96}
1108b ↘ Output Stream #2: {18, 49, 63}
1108c ↗ Output Stream #3: {}
    ┌ Output Stream #4: {}
1108d Current Offset: 0

┌─1104
{~~36~~, ~~18~~, ~~51~~, ~~60~~, ~~65~~, ~~67~~, ~~49~~, ~~96~~, ~~63~~, 5, 93, 81}

1108a                                               1132
  ↘ Output Stream #1: {36, 51, 60, 65, 67, 96}
1108b ↘ Output Stream #2: {18, 49, 63}
1108c ↗ Output Stream #3: {5}
    ┌ Output Stream #4: {}
1108d Current Offset: 0

┌─1104
{~~36~~, ~~18~~, ~~51~~, ~~60~~, ~~65~~, ~~67~~, ~~49~~, ~~96~~, ~~63~~, 5, ~~93~~, 81}
1108a
                                          1134
1108b ↘ Output Stream #1: {36, 51, 60, 65, 67, 96}
     Output Stream #2: {18, 49, 63, 93}
1108c ↗ Output Stream #3: {5}
    ┌ Output Stream #4: {}
1108d Current Offset: 0

┌─1104
{~~36~~, ~~18~~, ~~51~~, ~~60~~, ~~65~~, ~~67~~, ~~49~~, ~~96~~, ~~63~~, ~~5~~, ~~93~~, ~~81~~}
1108a                                          1136
  ↘ Output Stream #1: {36, 51, 60, 65, 67, 96}
1108b ↘ Output Stream #2: {18, 49, 63, 93}
1108c ↗ Output Stream #3: {5, 81}
    ┌ Output Stream #4: {}
1108d Current Offset: 0

FIG. 11C

Current Offset: 0

DATASET SUMMARY METADATA PROVIDING IMPROVED QUERY PERFORMANCE

FIELD

The present disclosure generally relates to providing summary metadata that can be used to help determine whether a summarized dataset contains data satisfying selection criteria.

BACKGROUND

Modern database systems are often tasked with processing huge amounts of data. For example, enterprise level database systems commonly have tables with hundreds of individual fields and often millions of rows, or more. Loading and processing datasets can use large amounts of computing resources, as well as time. It can be useful to determine whether a particular dataset includes, or likely includes, relevant information before loading and processing a dataset.

As a simple example, consider a numerical dataset. The numerical dataset may have a maximum value represented in the dataset and a minimum value represented in the dataset. The maximum and minimum values thus provide summary information for the dataset.

Assume that a query is received for data having a particular value. The summary information for a dataset can be analyzed to determine whether the particular value is less than or equal to the maximum value or greater than or equal to the minimum value (that is, the query value is between the maximum value and the minimum value). If the query value is not within the maximum and minimum values, it can be determined that the query value is not represented in the dataset.

Accordingly, the data itself in the dataset need not be loaded or analyzed since it does not have data relevant to the query, which saves time and computing resources. However, at least in some cases, the summary information may not establish whether a particular data value is present in the dataset. For example, a value to be searched may be within the maximum and minimum values, but still not be present in the dataset. Thus, the summary information can be used as a filter, where false positives can occur (an indication that a particular value is consistent with the summary information, but is not actually present in the dataset), but false negatives do not occur (if the particular value is not consistent with the summary information, then the particular value is definitely not in the dataset).

While various types of summary information have been used to help avoid loading and analyzing non-relevant data, issues remain. For example, summary information can require large amounts of storage, which may limit the use of summary information to particular datasets, where summary information is not available for other datasets. Summary information can also be computationally expensive to create and maintain.

In addition, it can be desirable to reduce the chances of false positive results occurring from the use of summary information, and the subsequent loading and processing of a dataset that does not contain relevant data. Accordingly, room for improvement exists.

Sorting of values, such as in an ascending or descending order, is a common operation in many computing processes. For example, at least some types of summary information as described above, such as certain types of indexes, require sorting. However, sorting remains computationally expensive. Accordingly, improved sorting techniques remain of interest.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

The present disclosure provides techniques and solutions for determining whether a particular value is in a dataset using summary information. A sorted set of unique values is received. The sorted set of unique values includes gaps between at least certain values. The gaps are determined, and the set of unique values is represented as a gap filter. The gap filter includes a starting value of the set of unique values, a set of gap lengths, and identifiers indicating a number of unique values between respective gaps. The gap filter serves as summary information that can be used to determine whether a value be present in the dataset. In at least some cases, the use of the summary information may provide false positive results. The representation of the gap filter can be modified to improve its compressibility, but may increase the number of false positives produced by the gap filter.

The present disclosure also provides techniques and solutions for sorting data. In a particular implementation, a sorting technique is provided that places values in a sorted order by adding an offset value to values that are not in a sorted order. The resulting sorted set of values is not truly sorted, in that the set of modified values is sorted, but the underlying data itself is not sorted. In another implementation, a sorting technique can use multiple streams or sets. When an out of order element is encountered, it can be added to a new stream, if such a stream is available. The sorting techniques can be used for a variety of purposes, including provided sorted data for use in generating summary data, or for providing sorted data to be used in determining an intersection between two datasets.

In one aspect, the present disclosure provides a process of defining a gap filter and using the gap filter to determine whether a specified value may be present in a dataset for which the gap filter is defined. At set of sorted unique values in a dataset sorted according to a sorting criterion is received. For values of the set of unique values, a plurality of gaps between at least a portion of the values of the set of unique values are determined. The set of unique values is represented as a gap filter, the gap filter includes: (1) a starting value of the set of unique values, (2) a set of gaps lengths for the plurality of gaps; and (3) identifiers indicating a number of unique values between respective gaps of the plurality of gaps.

A request is received to determine whether a specified value is present in the dataset. It is determined from the gap filter whether the specified value may be present in the dataset.

In another aspect, the present disclosure provides a process of defining summary information useable to determine whether a particular value may be present in a data set, including sorting a set of values for use in preparing the summary information by adding offset values to certain elements of the dataset to order the dataset. A set of values is received that is at least partially unsorted, the set of values representing values in a dataset.

The set of values is sorted to provide a sorted set of values sorted according to a sorting criterion. The sorting includes, for a second element in the set of unsorted values, determining that the second element is out of order compared with a first, preceding element in the set of unsorted values. It is determined whether the second element would be sorted compared with the first element if a current offset value was added to the second element. The current offset value is added to the second element.

Summary metadata for the dataset is defined using the sorted set of values. A request is received to determine whether a specified value is in the dataset. From the summary metadata, it is determined whether the specified value may be present in the dataset.

In a further aspect, the present disclosure provides a process of defining summary information useable to determine whether a particular value may be present in a data set, including sorting a set of values for use in preparing the summary information by sorting elements of the set of values into data streams. A set of values is received that is at least partially unsorted, the set of values representing values in a dataset. The set of values is sorted to provide a sorted set of values sorted according to a sorting criterion. The sorting includes, for an element of the set of unique values, determining whether the element is in a sorted order if placed in a first stream of processed values of the set of values. It is determined that the element would not be in a sorted order if placed in the first stream. It is determined whether an unused stream is available. In response to determining that an unused stream is available, the element is placed in the unused stream, the unused stream then being a second stream.

Summary metadata for the dataset is defined using the sorted set of values. A request is received to determine whether a specified value is in the dataset. From the summary metadata, it is determined whether the specified value may be present in the dataset.

In yet another aspect, the present disclosure provides a process of sorting a dataset for use in determining an intersection with another dataset. A set of values is received that is at least partially unsorted, the set of values representing values in a dataset.

The set of values is sorted to provide a sorted set of values sorted according to a sorting criterion. The sorting includes, for a second element in the set of unsorted values, determining that the second element is out of order compared with a first, preceding element in the set of unsorted values. It is determined whether the second element would be sorted compared with the first element if a current offset value was added to the second element. The current offset value is added to the second element. An intersection between the sorted set and another set of values is determined.

The present disclosure also includes computing systems and tangible, non-transitory computer-readable storage media configured to carry out, or includes instructions for carrying out an above-described method. As described herein, a variety of other features and advantages can be incorporated into the technologies as desired.

BRIEF DESCRIPTION OF THE DRAWINGS

FIG. 2 also illustrates a process for using summary information to determine whether particular data values may be in data subsets.

FIG. 6 illustrates how a compressed gap filter can be decompressed, and how a gap filter can be used to evaluate whether a given value may be present in a dataset summarized by the gap filter.

FIGS. 7A and 7B provide particular examples of how a particular gap filter can be evaluated to determine whether a specified value may be contained in the dataset summarized by the gap filter.

FIGS. 9A-9C illustrate a particular example of how values can be sorted using the technique of FIG. 8.

FIGS. 11A-11D illustrates a particular example of how values can be sorted using the process of FIG. 10.

DETAILED DESCRIPTION

Example 1—Overview

Figure 1:
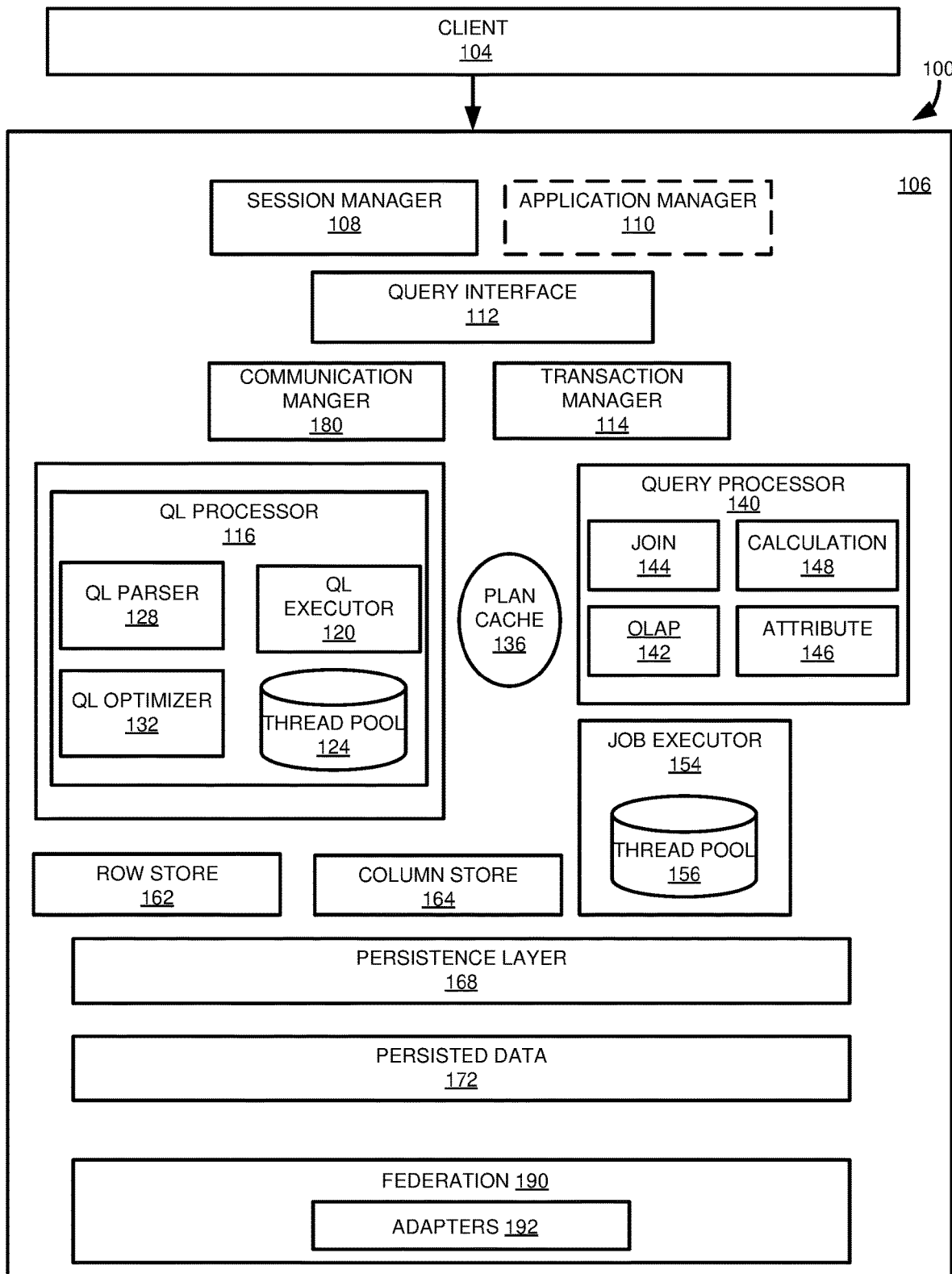
FIG. 1 is a diagram depicting an example database system which can be used in implementing aspects of disclosed technologies.

Modern database systems are often tasked with processing huge amounts of data. For example, enterprise level database systems commonly have tables with hundreds of individual fields and often millions of rows, or more. Loading and processing datasets can use large amounts of computing resources, as well as time. It can be useful to determine whether a particular dataset includes, or likely includes, relevant information before loading and processing a dataset.

As a simple example, consider a numerical dataset. The numerical dataset may have a maximum value represented in the dataset and a minimum value represented in the dataset. The maximum and minimum values thus provide summary information for the dataset.

Assume that a query is received for data having a particular value. The summary information for a dataset can be analyzed to determine whether the particular value is less than or equal to the maximum value or greater than or equal to the minimum value (that is, the query value is between the maximum value and the minimum value). If the query value is not within the maximum and minimum values, it can be determined that the query value is not represented in the dataset.

Accordingly, the data itself in the dataset need not be loaded or analyzed since it does not have data relevant to the query, which saves time and computing resources. However, at least in some cases, the summary information may not establish whether a particular data value is present in the dataset. For example, a value to be searched may be within the maximum and minimum values, but still not be present in the dataset. Thus, the summary information can be used as a filter, where false positives can occur (an indication that a particular value is consistent with the summary information, but is not actually present in the dataset), but false negatives do not occur (if the particular value is not consistent with the summary information, then the particular value is definitely not in the dataset).

While various types of summary information have been used to help avoid loading and analyzing non-relevant data, issues remain. For example, summary information can require large amounts of storage, which may limit the use of summary information to particular datasets, where summary information is not available for other datasets. Summary information can also be computationally expensive to create and maintain.

In addition, it can be desirable to reduce the chances of false positive results occurring from the use of summary data, and the subsequent loading and processing of a dataset that does not contain relevant data. Accordingly, room for improvement exists.

Sorting of values, such as in an ascending or descending order, is a common operation in many computing processes. For example, at least some types of summary information as described above, such as certain types of indexes, require sorting. However, sorting remains computationally expensive. Accordingly, improved sorting techniques remain of interest.

To aid in understanding disclosed innovations, the present disclosure may focus on particular uses of the disclosed innovations in relational database systems. However, it should be appreciated that disclosed techniques for defining and using summary information for a dataset, which can be referred to as "gap filters," can be used in other types of database systems, as well as more generally in scenarios where data is stored and may later be accessed using particular criteria. Similarly, disclosed sorting techniques can be used in creating summary information, including for use in creating gap filters, or other types of summary information, such as indexes, but can find other uses in relational databases, other types of database technologies, or in a variety of other types of computing processes.

In a relational database system, a variety of types of summary information have been used to help avoid the retrieval and processing of non-relevant information, such as indexes, zone maps, and bloom filters. Indexes implemented using techniques such as B+ trees, log-structured merge-trees, hash indexes, and tiered indexes are considered to be "heavyweight," as they can be computationally expensive to create and maintain, and can use large amounts of storage. Due to the heavyweight nature of indexes, indexes are often only created for particular tables, or particular table components (such as table columns) where the benefit provided by the index is expected to justify the computational and storage expenses.

In many cases, a database is accessed by predefined queries. For example, a particular software application may offer particular queries to users, where the users in at least some cases can provide actual values to be used in a pre-defined query, such as using literal substitution or parameterization. These types of queries can be referred to query templates, parameterized queries, or parameterized statements. Since these queries are expected to be executed on a regular basis, they may be more likely candidates for index creation as compared with indexes that might be used for ad hoc queries, which are created and executed as needed to access or manipulate particular information, rather than being pre-defined or pre-compiled. That is, while indexes could be created, for example, for all database tables, often indexes are not created for, or optimized for, ad hoc queries.

Even for pre-defined or pre-compiled queries, the costs of an index may result in indexes not being created for every database table (or portion, such as a column, thereof) that is referenced by such queries. For example, indexes may be created for table columns that are frequently used in operations such as WHERE clauses, JOIN conditions, or sorting criteria (such as an ORDER BY clause). Tables that are larger, have a higher proportion of unique values (cardinality), are less frequently updated (such as having primarily read-only access) may be stronger candidates for index creation. Various tools can be used to suggest the creation or modification or indexes, such as by analyzing query execution plans or monitoring the performance of queries using particular indexes.

Lightweight structures such as zone maps and bloom filters may be created for tables (or table columns) that are not selected for indexing. However, both of these techniques can serve as filters, indicating when a value is not in a dataset, but may result in false positives. Zone maps may provide reasonable results when data values are relatively clustered together, but provide a higher false positive rate when data is in multiple clusters, follows a pattern, or is randomly distributed.

Bloom filters can suffer from similar issues. As the number of elements in a set for which a bloom filter is defined increases, the storage required for the bloom filter can increase quickly. Correspondingly, if the space requirement for a bloom filter is constrained, typically the false positive rate will increase as the number of elements in the covered set increases.

The present disclosure provides a lightweight structure that can be used to determine whether particular data values may be present in a dataset. In at least some cases, the structure is referred to as a "gap filter." However, the gap filter can be implemented in ways that may not technically be considered as a "filter." For example, the gap filter can be defined such that false negative results are possible, or can be defined such that false positive results are not possible.

As will be discussed, the amount of false positive (and, correspondingly, in appropriate circumstances, a number of false negative) results can be subject to particular constraints. For example, a maximum number of false positive results can be set. When a gap filter is being modified to improve compression, the number of false positive results introduced through such manipulations may not exceed the budget. Thus, the budget can be used to implement a balance between compressibility and performance, in terms of a number of false positive results allowed by a given gap filter.

Generally, a gap filter identifies at least a portion of values present in a dataset, where at least one gap exists between two such values, meaning that the dataset does not contain values in the range represented by the gap. For example, consider a dataset that contains a value of 5 and a value 7, but does not contain a value of 6. The value of 6 represents a gap of length 1. A dataset may have multiple consecutive values without a gap. Similarly, a gap can include a single value or can contain multiple consecutive values.

Gap filters are typically created using sorted or at least semi-sorted data, as will be described. Unique values in the dataset can be used to define a representation of the unique values in the dataset and gaps between such values. Note that this discussion refers to "unique" values. A unique value is a value that occurs at least one time in the dataset and is different than other values in the dataset. Typically, gap filters do not "care" whether a given value occurs one time or multiple times in the dataset. For example, for use in determining what database data to retrieve and analyze, it is sufficient to know that a given value occurs at least once in a set of data. If it does, the dataset can be loaded and processed, and multiple occurrences of the unique value in the dataset can be identified.

In an implementation, an initially constructed gap filter identifies all unique values present in the dataset and gaps between such values. However, it can be desirable to create a compressed version of the gap filter using one or more compression methods. In a particular example, a given gap filter is analyzed to determine whether one or both of dictionary compression and run length encoding can be employed. In order to try and increase the compressibility of the filter, gaps can be removed from the gap filter. That is, a set of consecutive values can be considered together as a unit, even though one or more of such values are not present in the dataset.

It can thus be seen that removing a gap increases the false positive rate of the gap filter, while, in this case, preserving the property of being a "filter," in that the gap filter does not result in false negative results. Note that unless specifically indicated otherwise, a "gap filter" refers to the particular type of summary information described in the present disclosure, whether or not it serves as a "filter" under a strict definition of that term.

Similarly, the size of a gap can be reduced, rather than removing the gap, at the cost of increasing the false positive rate. Reducing a gap size can be used to create a longer run of similarly sized gaps, resulting in more efficient run length encoding, or to reduce the number of gap sizes used in a gap filter representation, which can reduce the size of a dictionary needed for dictionary encoding.

Often, data is sorted prior to being used in a computer-implemented process. For example, in the context of database indices, indexes defined on sorted values can result in faster lookup operations, reduced I/O operations, improved range queries, enhanced compression, and improved performance of operations exhibiting a sequential access pattern (such as an operation that scans data in a specific order). However, sorting can also be computationally expensive. The present disclosure provides techniques, which can be referred to as "lazy sorting," for providing semi-sorted data, which can be used in conjunction with the gap filter described above, in other filter/indexing techniques, or other applications where non-fully sorted data may be sufficient. Another disclosed sorting technique, which can be referred to as a "stream sort," can be used to produce either strictly sorted or non-strictly sorted data.

Disclosed lazy sorting techniques can include an operation to apply an offset value to out of order data, where the offset value can be progressively increased as out of order values are encountered. While the data is not strictly ordered, a gap filter can be created on the semi-sorted data. When it is desired to search for a particular value, the value can be searched by itself and with the addition of each offset value used. Thus, rather than incurring sorting costs, multiple searches can be performed. In at least some cases, costs associated with performing multiple queries on a semi-sorted dataset are less than a cost of fully sorting the dataset.

In other example, a plurality of data streams can be defined, and data can be sorted into a different data stream whenever it is not possible to place a data value in the correct order in an existing data stream. The number of possible data streams can be limited, and the offset value approach described above applied once the allowed number of data streams have been exhausted or before they are exhausted. When all of the data has been processed, data from the data streams can be merged.

Example 2—Example Database Environment

FIG. 1 illustrates an example database environment 100. The database environment 100 can include a client 104. Although a single client 104 is shown, the client 104 can represent multiple clients. The client or clients 104 may be OLAP clients, OLTP clients, or a combination thereof.

The client 104 is in communication with a database server 106. Through various subcomponents, the database server 106 can process requests for database operations, such as requests to store, read, or manipulate data (i.e., CRUD operations). A session manager component 108 can be responsible for managing connections between the client 104 and the database server 106, such as clients communicating with the database server using a database programming interface, such as Java Database Connectivity (JDBC), Open Database Connectivity (ODBC), or Database Shared Library (DBSL). Typically, the session manager 108 can simultaneously manage connections with multiple clients 104. The session manager 108 can carry out functions such as creating a new session for a client request, assigning a client request to an existing session, and authenticating access to the database server 106. For each session, the session manager 108 can maintain a context that stores a set of parameters related to the session, such as settings related to committing database transactions or the transaction isolation level (such as statement level isolation or transaction level isolation).

For other types of clients 104, such as web-based clients (such as a client using the HTTP protocol or a similar transport protocol), the client can interface with an application manager component 110. Although shown as a component of the database server 106, in other implementations, the application manager 110 can be located outside of, but in communication with, the database server 106. The application manager 110 can initiate new database sessions with the database server 106, and carry out other functions, in a similar manner to the session manager 108.

The application manager 110 can determine the type of application making a request for a database operation and mediate execution of the request at the database server 106, such as by invoking or executing procedure calls, generating query language statements, or converting data between formats useable by the client 104 and the database server 106. In particular examples, the application manager 110 receives requests for database operations from a client 104, but does not store information, such as state information, related to the requests.

Once a connection is established between the client 104 and the database server 106, including when established through the application manager 110, execution of client requests is usually carried out using a query language, such as the structured query language (SQL). In executing the request, the session manager 108 and application manager 110 may communicate with a query interface 112. The query interface 112 can be responsible for creating connections with appropriate execution components of the database server 106. The query interface 112 can also be responsible for determining whether a request is associated with a previously cached statement or a stored procedure, and calling the stored procedure or associating the previously cached statement with the request.

At least certain types of requests for database operations, such as statements in a query language to write data or manipulate data, can be associated with a transaction context. In at least some implementations, each new session can be assigned to a transaction. Transactions can be managed by a transaction manager component 114. The transaction manager component 114 can be responsible for operations such as coordinating transactions, managing transaction isolation, tracking running and closed transactions, and managing the commit or rollback of transactions. In carrying out these operations, the transaction manager 114 can communicate with other components of the database server 106.

The query interface 112 can communicate with a query language processor 116, such as a structured query language processor. For example, the query interface 112 may forward to the query language processor 116 query language statements or other database operation requests from the client 104. The query language processor 116 can include a query language executor 120, such as a SQL executor, which can include a thread pool 124. Some requests for database operations, or components thereof, can be executed directly by the query language processor 116. Other requests, or components thereof, can be forwarded by the query language processor 116 to another component of the database server 106. For example, transaction control statements (such as commit or rollback operations) can be forwarded by the query language processor 116 to the transaction manager 114. In at least some cases, the query language processor 116 is responsible for carrying out operations that retrieve or manipulate data (e.g., SELECT, UPDATE, DELETE). Other types of operations, such as queries, can be sent by the query language processor 116 to other components of the database server 106. The query interface 112, and the session manager 108, can maintain and manage context information associated with requests for database operation. In particular implementations, the query interface 112 can maintain and manage context information for requests received through the application manager 110.

When a connection is established between the client 104 and the database server 106 by the session manager 108 or the application manager 110, a client request, such as a query, can be assigned to a thread of the thread pool 124, such as using the query interface 112. In at least one implementation, a thread is associated with a context for executing a processing activity. The thread can be managed by an operating system of the database server 106, or by, or in combination with, another component of the database server. Typically, at any point, the thread pool 124 contains a plurality of threads. In at least some cases, the number of threads in the thread pool 124 can be dynamically adjusted, such in response to a level of activity at the database server 106. Each thread of the thread pool 124, in particular aspects, can be assigned to a plurality of different sessions.

When a query is received, the session manager 108 or the application manager 110 can determine whether an execution plan for the query already exists, such as in a plan cache 136. If a query execution plan exists, the cached execution plan can be retrieved and forwarded to the query language executor 120, such as using the query interface 112. For example, the query can be sent to an execution thread of the thread pool 124 determined by the session manager 108 or the application manager 110. In a particular example, the query plan is implemented as an abstract data type.

If the query is not associated with an existing execution plan, the query can be parsed using a query language parser 128. The query language parser 128 can, for example, check query language statements of the query to make sure they have correct syntax, and confirm that the statements are otherwise valid. For example, the query language parser 128 can check to see if tables and records recited in the query language statements are defined in the database server 106.

The query can also be optimized using a query language optimizer 132. The query language optimizer 132 can manipulate elements of the query language statement to allow the query to be processed more efficiently. For example, the query language optimizer 132 may perform operations such as unnesting queries or determining an optimized execution order for various operations in the query, such as operations within a statement. After optimization, an execution plan can be generated, or compiled, for the query. In at least some cases, the execution plan can be cached, such as in the plan cache 136, which can be retrieved (such as by the session manager 108 or the application manager 110) if the query is received again.

For the purposes of the present disclosure, one task that can be performed by the query language optimizer 132 is determining a location where a request for a database operation, or a portion thereof, should be performed. For instance, a complex query may be submitted that reads data from multiple data sources. At least one of the data sources may be a virtual table, and the request can be performed on a replica table of the database server 106, or the request can be sent to a remote system via data federation, and results returned to the database server.

Once a query execution plan has been generated or received, the query language executor 120 can oversee the execution of an execution plan for the query. For example, the query language executor 120 can invoke appropriate subcomponents of the database server 106.

In executing the query, the query language executor 120 can call a query processor 140, which can include one or more query processing engines. The query processing engines can include, for example, an OLAP engine 142, a join engine 144, an attribute engine 146, or a calculation engine 148. The OLAP engine 142 can, for example, apply rules to create an optimized execution plan for an OLAP query. The join engine 144 can be used to implement relational operators, typically for non-OLAP queries, such as join and aggregation operations. In a particular implementation, the attribute engine 146 can implement column data structures and access operations. For example, the attribute engine 146 can implement merge functions and query processing functions, such as scanning columns.

In certain situations, such as if the query involves complex or internally parallelized operations or sub-operations, the query executor 120 can send operations or sub-operations of the query to a job executor component 154, which can include a thread pool 156. An execution plan for the query can include a plurality of plan operators. Each job execution thread of the job execution thread pool 156, in a particular implementation, can be assigned to an individual plan operator. The job executor component 154 can be used to execute at least a portion of the operators of the query in parallel. In some cases, plan operators can be further divided and parallelized, such as having operations concurrently access different parts of the same table. Using the job executor component 154 can increase the load on one or more processing units of the database server 106, but can improve execution time of the query.

The query processing engines of the query processor 140 can access data stored in the database server 106. Data can be stored in a row-wise format in a row store 162, or in a column-wise format in a column store 164. In at least some cases, data can be transformed between a row-wise format and a column-wise format. A particular operation carried out by the query processor 140 may access or manipulate data in the row store 162, the column store 164, or, at least for certain types of operations (such a join, merge, and sub-query), both the row store 162 and the column store 164. In at least some aspects, the row store 162 and the column store 164 can be maintained in main memory.

A persistence layer 168 can be in communication with the row store 162 and the column store 164. The persistence layer 168 can be responsible for actions such as committing write transaction, storing redo log entries, rolling back transactions, and periodically writing data to storage to provided persisted data 172.

In executing a request for a database operation, such as a query or a transaction, the database server 106 may need to access information stored at another location, such as another database server. The database server 106 may include a communication manager 180 component to manage such communications. The communication manger 180 can also mediate communications between the database server 106 and the client 104 or the application manager 110, when the application manager is located outside of the database server.

In some cases, the database server 106 can be part of a distributed database system that includes multiple database servers. At least a portion of the database servers may include some or all of the components of the database server 106. The database servers of the database system can, in some cases, store multiple copies of data. For example, a table may be replicated at more than one database server. In addition, or alternatively, information in the database system can be distributed between multiple servers. For example, a first database server may hold a copy of a first table and a second database server can hold a copy of a second table. In yet further implementations, information can be partitioned between database servers. For example, a first database server may hold a first portion of a first table and a second database server may hold a second portion of the first table.

In carrying out requests for database operations, the database server 106 may need to access other database servers, or other information sources, within the database system, or at external systems, such as an external system on which a remote data object is located. The communication manager 180 can be used to mediate such communications.

For example, the communication manager 180 can receive and route requests for information from components of the database server 106 (or from another database server) and receive and route replies.

The database server 106 can include components to coordinate data processing operations that involve remote data sources. In particular, the database server 106 includes a data federation component 190 that at least in part processes requests to access data maintained at remote system. In carrying out its functions, the data federation component 190 can include one or more adapters 192, where an adapter can include logic, settings, or connection information usable in communicating with remote systems, such as in obtaining information to help generate virtual parameterized data objects or to execute requests for data using virtual parameterized data objects (such as issuing a request to a remote system for data accessed using a corresponding parameterized data object of the remote system). Examples of adapters include "connectors" as implemented in technologies available from SAP SE, of Walldorf, Germany. Further, disclosed techniques can use technologies underlying data federation techniques such as Smart Data Access (SDA) and Smart Data Integration (SDI) of SAP SE.

To ensure efficient query execution and minimize unnecessary data retrieval, the database server 106 may employ various indexing and filtering mechanisms. Indexing and filtering are useful in helping to identify and retrieve only the relevant portions of data. This can be particularly significant in a distributed database environment where accessing remote data sources could be time-consuming and resource intensive.

For example, a data filtering module (not depicted in the described architecture) could use zone maps, indexes, bloom filter, or gap filers of the present disclosure, to determine which sections or partitions of a table need to be scanned based on the query criteria. In particular, zone maps store the minimum and maximum values for each partition, allowing the system to skip sections that are not relevant to the query, enhancing query performance.

Additionally, the database server 106 can integrate bloom filters as a probabilistic data structure to determine if a given data item is present in a dataset without having to access the dataset itself. The bloom filter can be particularly useful in join operations where the database needs to quickly verify the presence of a specific value in another table or dataset. If a bloom filter indicates that a value is definitely not present, the system can avoid unnecessary data accesses, thus speeding up the join operation. Similar benefits are provided by the disclosed gap filters.

Integration of such filters and indexes can be done at various levels within the described architecture. For instance, the query language optimizer 132, while determining the most efficient execution plan for a query, can leverage both disclosed gap filters (or zone maps and bloom filters). Based on a gap filter, for example, the query language optimizer 132 can determine which partitions or segments of data are relevant to the query. Similarly, by consulting a gap filter (or zone map or bloom filter), the query language optimizer 132 can make educated decisions on whether certain data lookups are necessary, thereby refining the execution plan.

When the query processing engines of the query processor 140, such as the OLAP engine 142 or the join engine 144, access data stored in the database server 106, the presence of gap filters, bloom filters, or zone maps can help provide that only the necessary partitions or columns of the row store 162 or column store 164 are accessed, streamlining data retrieval processes.

Just as data within a database is dynamic and evolves over time, the associated gap filters, zone maps, or bloom filters need are typically maintained updated. Such updates can be handled by dedicated components within the database server 106 or can be integrated into existing components like the persistence layer 168.

Figure 2:
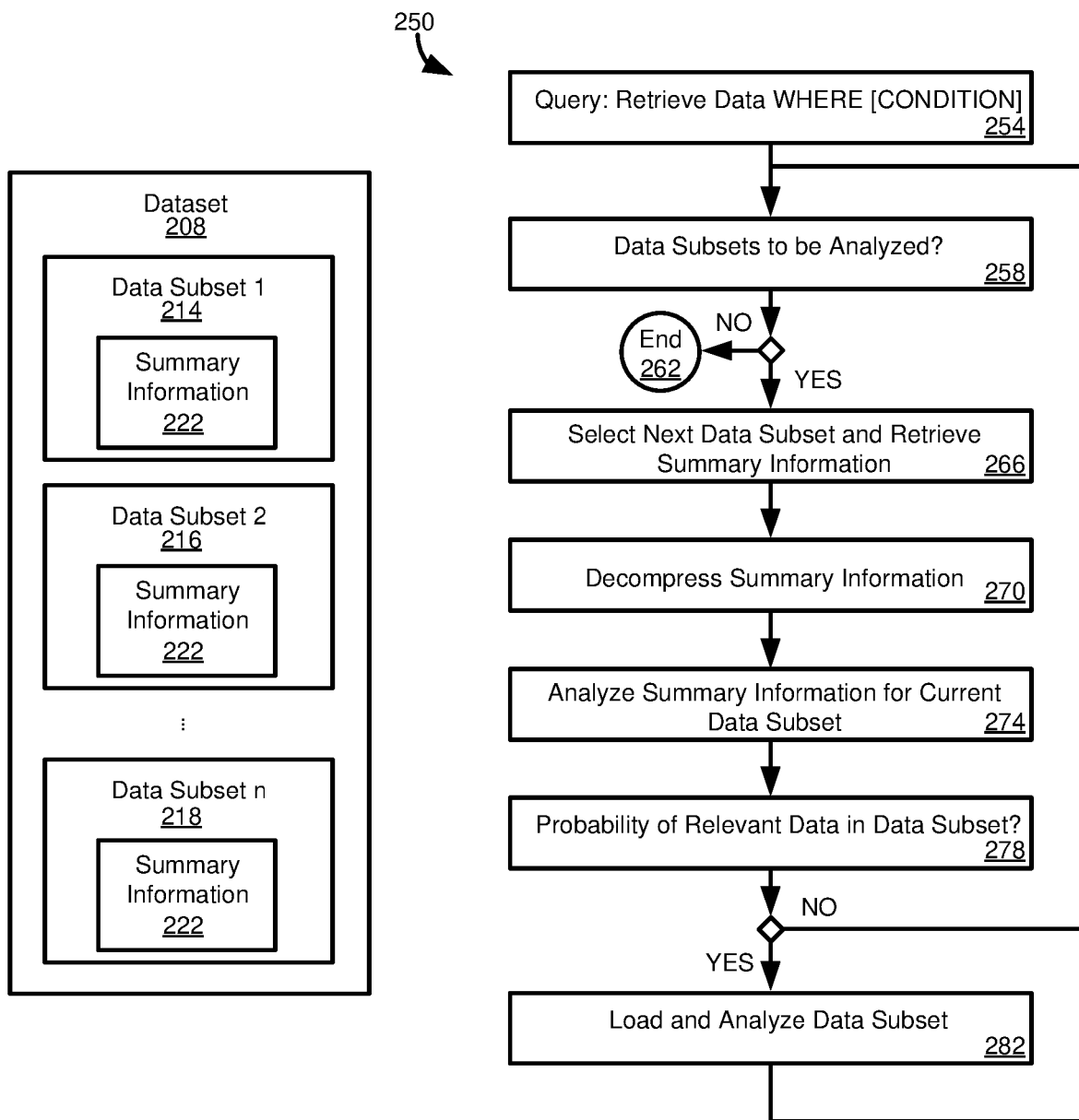
FIG. 2 illustrates how a dataset can be divided into multiple subsets, and where data in the subsets may be described by summary information.

Example 3—Example Dataset Summary Information and Use Thereof in Query Processing FIG. 2 illustrates a dataset 208 and a plurality of data subsets 214, 216, 218 of the dataset. As a particular illustrative example, the dataset 208 can correspond to a column of data of a relational database table. For a variety of reasons, it can be beneficial to store data in the subsets 214, 216, 218, such as in pages. These reasons can include that particular hardware, such as disk storage or memory, may be designed to transfer data in particular unit sizes, which can correspond to the pages, including as part of temporarily transferring data from disk to a buffer in computer memory. Of particular relevance here, similar to chapters in a book, pages can make it easier to retrieve desired information, rather than having to search the entire book. In the same way that a book chapter contains related information, pages can also help provide that related data is stored together, which can reduce the amount of data that needs to be retrieved and analyzed when looking for particular information.

To help achieve some of the benefits noted above, it can be useful to provide summary information 222 (which can also be referred to as summary metadata-metadata that summarizes the data in one of the data subsets) for the data subsets 214, 216, 218. For example, the summary information 222 can be used to help identify what information is stored in a given data subset 214, 216, 218 so that it can be determined whether such data subset should be retrieved and further processed. The summary information 222 can correspond to an index or filter, including the gap filters of the present disclosure. Without some kind of summary information 222, each data subset 214, 216, 218 may need to be loaded and analyzed to determine whether it contains relevant information. Thus, while having data subsets 214, 216, 218 may be useful for other reasons, the summary information 222 allows for decisions to be made as to what data subsets should be loaded and further processed.

FIG. 2 also illustrates a process 250 for analyzing the data subsets 214, 216, 218. At 254 a query is received, such a database query that requests data satisfying one or more particular selection criteria reflected in a WHERE clause. It can be determined at 258 whether data subsets 214, 216, 218 in the dataset 208 remain to be analyzed. If not, the process 250 can end at 262. Otherwise, the process 250 can proceed to 266 where a next data subset 214, 216, 218 is selected and its summary information 222 retrieved. In some cases, including with particular implementations of disclosed gap filters, the summary information 222 may be compressed, and, if so, the summary information can be decompressed at 270.

The summary information 222 is analyzed at 274. At 278, it is determined whether the is a probability of relevant data being in the data subset. For example, a gap filter can be consulted to determine whether a particular value falls within a gap, is present as a unique value, or is located within a sequence of consecutive values. As noted above, the results of analyzing the gap filter, when configured as a true filter, will not result in a false negative result, but may provide a false positive. If the data subset 214, 216, 218 was not identified as having relevant data using the summary information 222, the process 250 can return to 258. Otherwise, the data subset 214, 216, 218 can be loaded and analyzed according to a particular use scenario at 282, and then the process 250 can return to 258. Again, at least certain summary information 222 can be associated with false positive results, and so it may be determined at 282 from the actual data in the data subset 214, 216, 218 that the data subset does not have data relevant to the query received at 254.

Example 4—Example Gap Filter Definition and Compression

Figure 3:
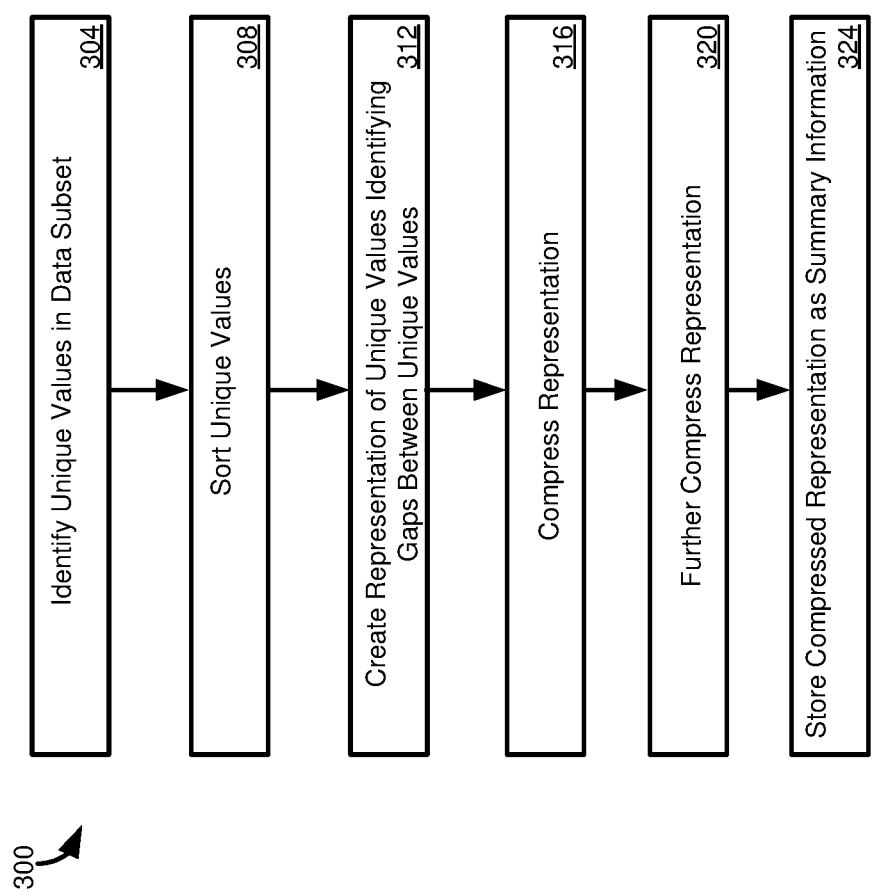
FIG. 3 is a flowchart of an example process for creating a gap filter.

FIG. 3 provides a flowchart of general operations in a process 300 of constructing a gap filter according to the present disclosure. At 304, unique values in a particular data subset are identified. Note that while typically gap filters are used with multiple data subsets of a dataset, the techniques of the present disclosure, including the process 300, can be used with a single dataset, which can correspond to the data subset of the operations in the process.

At 308, unique values in the data subset are sorted. Sorting can be accomplished using any suitable sorting technique, and the data can be fully sorted or partially sorted. For example, the data in the particular data subset of the process 300 can itself be divided into different subsets, where data in each subset is ordered with respect to the data in that subset. Suitable sorting techniques include bubble sort, selection sort, insertion sort, merge sort, or quick sort. The lazy sorting and stream sorting techniques described herein can also be used.

A representation of the sorted unique values is created at 312. The representation identifies gaps between unique values in the data subset, and thus can be used to also identify unique values that are (or at least may be) present in the data subset. In some cases, information is stored both about gaps in the data subset and a number of consecutive unique values that may be present in the data subset. An example gap filter representation is provided in FIG. 4A, and the creation and use of this example representation will be described in detail as the disclosure proceeds.

The representation of unique values is compressed at 316. For example, the representation can be compressed using one or both of dictionary compression or run length encoding. The run length encoding information can be further encoded, such as according to a dictionary compression schema, at 320. The compressed representation is stored as summary information at 324.

Example 5—Example Gap Filter Manipulation for Improved Compression

FIGS. 4A-4D illustrate an example representation of a gap filter of the present disclosure and example operations that can be performed to enhance the compressibility of the gap filter. From a dataset, a set of unique values 404 is determined. That is, a given value of the unique values 404 occurs at least once in the dataset or may occur multiple times. However, even when the unique value is included in the dataset multiple times, it is only represented once in the set of unique values 404. The set of unique values 404 is shown as unsorted. The set of unique values 404 can be sorted to provide a sorted set of unique values 408. Although the sorted set of unique values 408 is shown as fully sorted, in at least some cases, including as will be further described, the sorted set of unique values is not truly sorted. That is, the data in the set 408 may not include all of the original unique values of the set 404, but rather may include modified unique values where the modified unique values and unmodified unique values are sorted in the set 408. That is, the sorting process may produce a list of values that is sorted, but the sorting is "superficial," in a way, in that the underlying values themselves are not fully sorted.

A first representation 412 of the sorted set of unique values 408 can be created. The first representation 412 includes a number of elements 414, 416. The elements 414 correspond to unique values of the set of sorted unique values 408 and are placed in the first representation 412 according to their sorted order. Elements 416 are shown as having a value of " . . . " where the value can, depending on the scenario, indicate a gap or can indicate a series of consecutive unique values of the set of sorted unique values 408. In other cases, different values can be used to represent gaps and sequences of consecutive unique values.

Note that, in the gap filter representation 412, a unique value in the representation need not correspond to a unique value in the set 408. That is, unique values in the gap filter representation 412 include values of the set 408, but may also include one or more unique values that are not in the set. Introduction of unique values that are not in the set 408 correspond to false positive results, which decrease the accuracy of the gap filter, but can improve its compressibility.

The first representation 412 includes a first set of values 422 above the elements 416, representing gaps, and a second set of values 424 underneath the elements 414, representing a number of consecutive unique elements when an element 416 serves this purpose, as opposed to indicating a gap between unique values. The values 424 can be referred to as "nSet" values (for number in set). A value 422 above an element 414 indicates that the element corresponds to a gap, and the value 422 is the length of a gap. A value 424 greater than one underneath an element 414 indicates that the following element 416 represents a number of consecutive unique values, rather than representing a gap length.

As a particular example of a gap, consider element 416a, having a value 422a of "17," indicating a number of values in the gap represented by element 416a. That is, the element 414 that follows the element 414a (having a value of 18) has a value of "36." There are 17 integers between the values of 18 and 36, which corresponds to the value 422a of "17." The other values 422 are calculated in a similar manner.

In the first representation 412, all of the values 424 are "1," since none of the elements 414 are consecutive.

The first representation 412 exactly describes the sorted set of unique values 408. That is, the first representation 412 can be consulted to determine whether a particular value is in the set of unique values 408, and the answer will be exactly correct, with no false positives or false negatives.

Figure 4A:
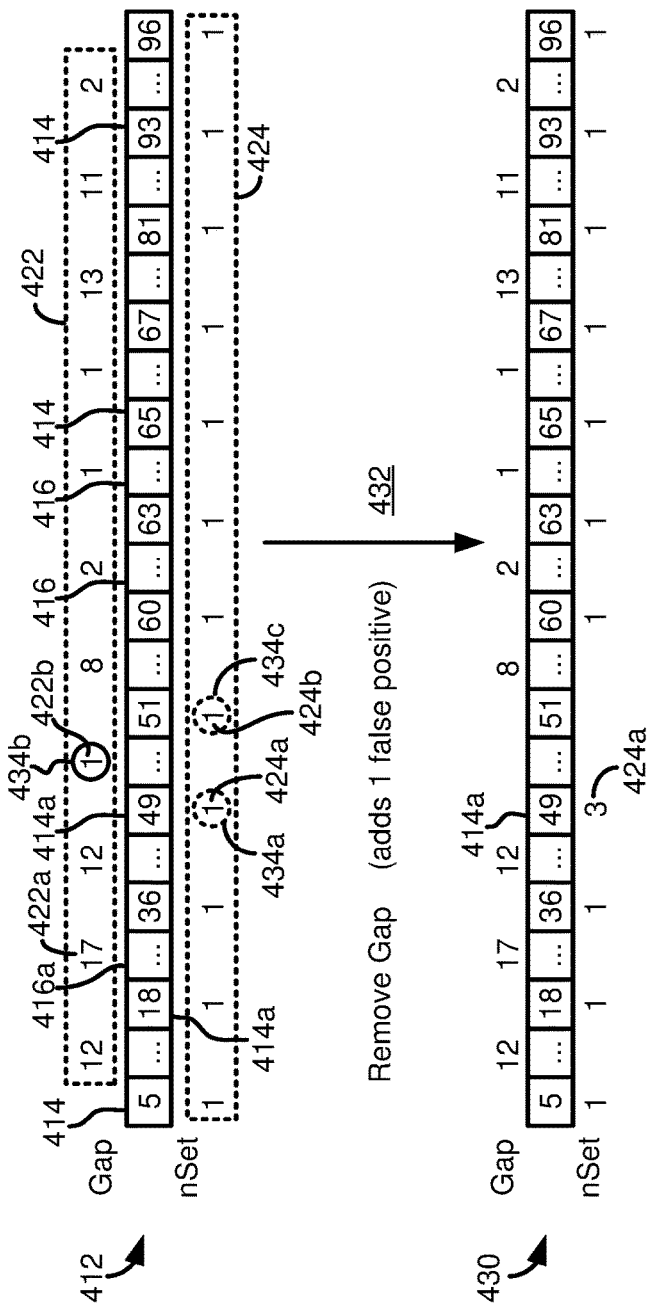
FIGS. 4A-4D illustrates example operations, and code implementing such operations, that can be used to manipulate an initial gap filter representation into a more compressible form.

A number of operations can be used to adjust an initial representation of a sorted set of unique values, such as the first representation 412. In particular FIG. 4A illustrates a second representation 430 of the sorted set of unique values 408 after performing an operation 432 to remove a gap from the first representation 412. Consider the values 422 and 424 within circles 434a-434c. Circle 434b indicates a gap of 1, while circles 434a and 434c indicate that each unique value of an element 414 is a single element in a sequence.

The remove gap operation 432 results in the insertion of a value into a gap, so that the gap is eliminated. Since the value inserted into the gap is not a value of the original set of unique values 404, it introduces a possibility, in this case a single possibility, of a false positive value being provided by the gap filter of the second representation 430.

The outcome of the remove gap operation 432 is reflected in the removal of the element 422b, the update of the value of the element 424a from "1" to "3" (indicating a sequence of three consecutive unique values) and the removal of the element 424c. That is, the updated value of the element 424a, and the removal of elements 422b and 424c, indicate that the element 414a represents a consecutive sequence of the unique values, starting at "49" and ending at "51."

Again, the update of element 424a results in the value of "50," which is not in the original set of unique values 404, as being indicated as present by the second representation 430 of the gap filter. If a request is provided to determine whether the value of "50" is present in the set of unique values 404, the result of using the second representation 430 will be that the value is present in the set of unique values, even though it is not actually present-providing a false positive result.

FIG. 4A also provides example code 438 for an implementation of a computer function to remove a gap provided that a cost associated with removing the gap does not exceed a cost value. That is, as will be further described, a process of manipulating the first representation 412 can be provided with a budget, such as corresponding to a number of false positive operations that may be introduced as part of such process. In the example code 438, a cost associated with the gap removal functionality is equal to the length of the gap being removed, since each element removed from a gap increases the number of false positive results by one. The remove gap function 438 itself calls a ReduceGap function, which takes the size of the gap reduction as an argument. Typically, information useable to locate the gap to be removed/reduced is also provided to the ReduceGap function.

Figure 4B:
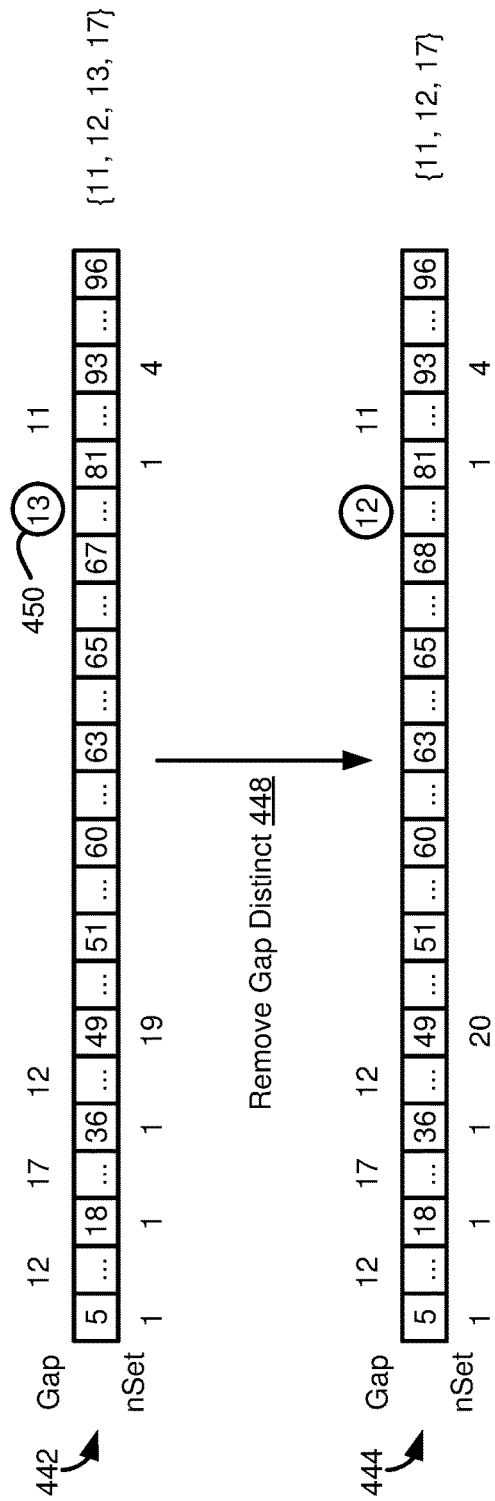

FIG. 4B illustrates how a third representation 442 of the set of sorted unique values 408 can be modified to assist in compression, providing a fourth representation 444 of the set of sorted unique values. The third representation 442 can be produced by performing various options on the second representation 430. A more comprehensive description of how the first representation 412 can be modified to enhance compression is provided later in the discussion of FIGS. 5A and 5B.

The fourth representation 444 results from applying an operation 448 to the third representation 442 that reduces a number of values needed to represent gaps in the third representation, which can in turn reduce the size of a dictionary used in dictionary compression of a final representation of the set of sorted unique values 408. The third representation 442 includes gaps of four sizes {11, 12, 13, 17}, which are values that will be represented in a dictionary for dictionary compression. Note that the third representation 442 includes two gaps having a size of 12, but both can be represented by the same dictionary value, and so the set of gap sizes only needs to indicate that a gap of size 12 is present in the third representation.

The operation 448 involves analyzing instances of the different gap sizes for the third representation 442 to determine whether a gap size can be decreased such that instead of being represented by a unique value in the set of gap sizes, it can be represented as an instance of another gap size that is already in the set of gap sizes. Note that at least in some cases the operation 448 does not involve increasing a gap size, as that could lead to false negative results.

In the third representation 442, it can be seen that there is a single instance 450 of a gap having a length of 13. The starting value of the gap is 68 and the ending value of the gap is 80. It can be seen that prior to the value of the unique value of 67 prior to the gap with the value of 13 is the ending value of a sequence of 19 consecutive unique values (where the values can be unique values that are actually in the set of unique values 404 or can be unique values that were added to enhance compression, but correspond to false positive results). The sequence of unique values can be increased to 20 by including the value of 68, even though 68 is not in the set of unique values 404. Thus, making this change would introduce an additional false positive result into a resultant gap filter. However, increasing the sequence of unique values to 20 would reduce the size of the subsequent gap from 13 to 12, removing one of the unique values from the set of unique gap values in the third representation. It can be seen that the fourth representation 444 is associated with a set of unique gap filter values {11, 12, 17}, one less than needed for the third representation 442.

FIG. 4B provides example code 458 for performing the operation 448. The code 458 operates by looking for gaps having a smaller sizer than a selected gap, g. For such gaps, a cost is defined as the size difference between the gap g and an identified, smaller gap i. The cost corresponds to the number of added false positive results from reducing a gap size. If the cost is less than the available budget, execution of the code 458 proceeds.

If reducing a gap to a size of a smaller gap is within a given budget, the code 458 checks to see if it would reduce the number of distinct gap sizes. If so, the gap g is reduced, otherwise the code 458 continues if there are additional, smaller gap sizes to be analyzed.

Figure 4C:
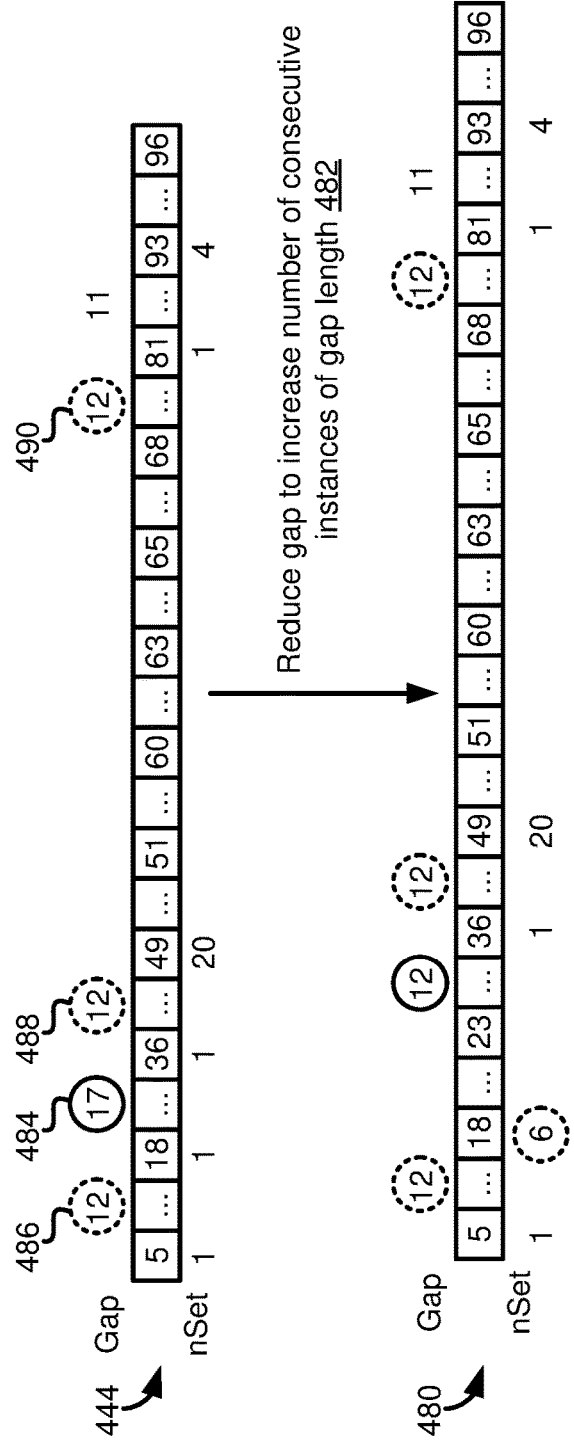

FIG. 4C illustrates how the fourth representation 444 of the set of sorted unique values 408 can be converted to a fifth representation 480 of the set of sorted unique values by performing an operation 482 that checks to see if a size of a given gap can be reduced to match a size of neighboring gap. The operation 482 can be beneficial, in that it creates longer sequences of gaps having the same size, which makes run length encoding more efficient.

In FIG. 4C, consider gap 484, having a size of 17. The gap 484 is adjacent to gaps 486 and 488, which both have a length of 12, where gap 488 also neighbors a gap 490, having a length of 12. Thus, it can be seen that if the gap 484 could have its size reduced from 17 to 12, that there would be a run of four gaps of size 12, which can be efficiently compressed using run length encoding using a single description, as compared with the fourth representation 444, which uses three descriptions, one for the isolated gap 486 of size 12, one for the isolated gap 484 of size 17, and one for the run of two gaps 488, 490, of size 12 (and in some cases even more values would be used, such as when runs of only two occurrences are not compressed using run length encoding).

FIG. 4C provides example code 494 for performing the operation 482. The code 494 checks to see if a given gap has a prior gap and a subsequent gap, if not the code does not continue to execute. If the given gap has both neighbors, the code 494 checks to see whether both neighbor gaps have the same length. If not, the code 494 ceases execution. If so, the code 488 determines a difference between the lengths of the given gap and the neighbor gap. If that value, representing a number of false positives that would be introduced by the operation 482 is less than a current budget, the operation 482 is carried out by the code 494. Note that, in at least some cases, the code 494 also determines whether the size of the neighboring gaps is less than the given gap.

The code 494 results in the operation 482 only being applied if a run of at least three identical gaps would be created. If desired, the operation 482 can be applied if at run of at least two identical gap lengths would be created. In that case, the code 494 can be modified to proceed if at least one neighboring gap exists and the given gap can have its length reduced to equal the length of the neighboring gap. Similarly, the code 494 can be modified to executive only if a run longer than a value higher than three would be created.

Figure 4D:

The operation types 432, 448, 482 described in the discussion FIGS. 4A-4C can be applied in a particular order, including as shown in the code 496 of FIG. 4D. The code 496 processes gaps from the smallest gap size to the largest gap size. In at least some cases, if there are multiple gaps of the same size, the code 496 processes gaps of this size from left to right. As long as gaps remain, the code 496 tries to apply the operations 432, 448, 482 in the listed order. That is, the code 496 first tries to reduce the number of distinct gap values for a representation of the set of sorted unique values 408, then tries to create longer consecutive runs of a particular gap size, and finally checks to see if any gaps can be removed. Again, because of the use of a budget variable in the operations 432, 448, 482, the code 496 only executes so long as there is remaining budget, allowing for a balance between compressibility and a number of false positive results.

Example 6—Detailed Example Gap Filter Manipulation and Compression Process

Figure 5A:
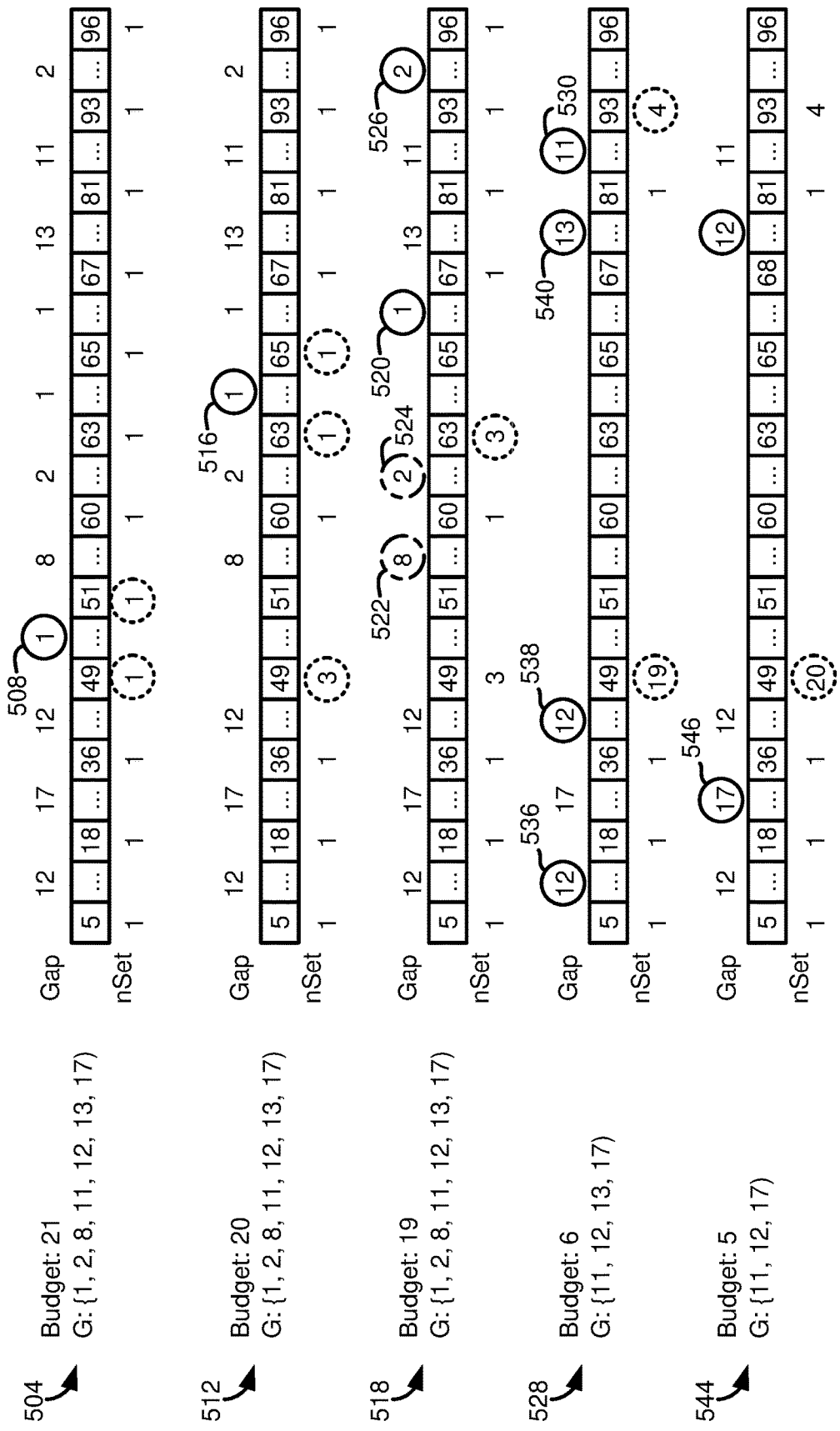
FIGS. 5A and 5B illustrate a particular example of how the operations in FIGS. 4A-4C can be used to manipulate a gap filter representation into a more compressible form, as well as how gap filters may be compressed.
Figure 5B:
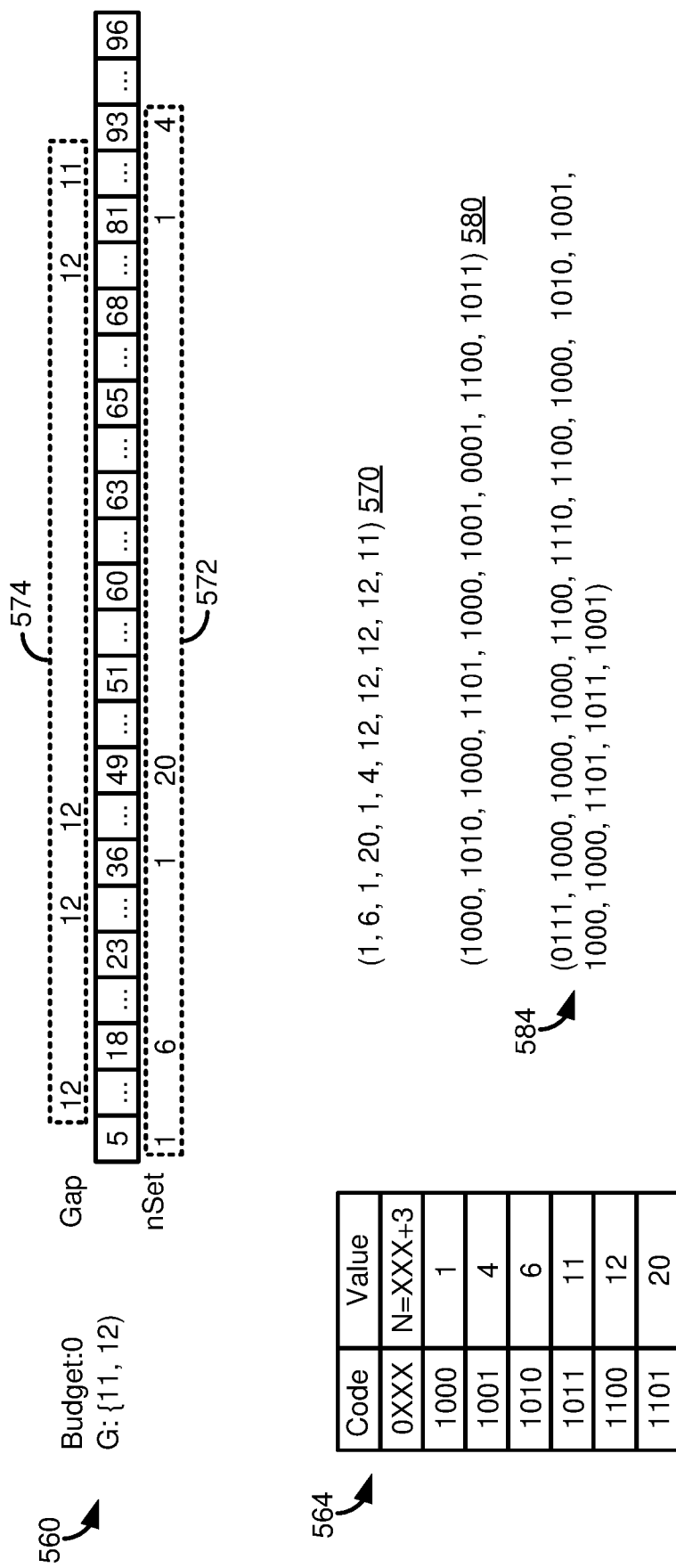

FIGS. 5A and 5B provide a more complete analysis of the first representation 412 of the sorted set of unique values 408, which is shown as representation 504 of FIG. 5A. It can be seen that initially a budget for manipulating the sorted set of unique values 408 is 21, and that the first representation 504 has a total of 7 unique gap values. It is determined that a gap 508 can be removed at the cost of one false positive, resulting in a second representation 512.

Looking at the second representation, a gap 516 can be removed in a similar manner as the gap 508 to provide a third representation 518. For expediency, multiple operations are considered for the third representation 518. Looking at a gap 520, it can be seen that the gap length of 1 cannot be reduced to eliminate a discrete gap length, and that the gap length cannot be reduced to create a longer run of a common gap length. However, the gap 520 can be removed. Gaps 522 and 524 can also be removed in the remove gap operation, at a cost of 11 false positives. The next smallest gap, gap 526 can then be analyzed. In a similar manner as for the gap 520, the gap 524 cannot be shortened to reduce the number of unique gap lengths (since the value of 1 was already removed as an element as a result of the preceding operations), nor can its length be reduced to increase a run length of a particular gap size. However, the gap can be removed at a cost of two false positives.

The two gap removal operations result in a fourth representation 528, and the initial budget of 21 false positives has now been reduced to 6. A gap 530, with a length of 11, is now the smallest gap, and is analyzed next. In this case, it can be seen that gap 530 is the only gap having a gap length of 11. Thus, if the length of gap 530 can be reduced to a value of another gap, the gap length of 11 can be removed from the set of unique gap lengths. However, there are no smaller gaps in the set of unique gap lengths, and so this operation cannot be performed. In a similar manner, the size of the gap 530 cannot be reduced to create a longer run of a particular gap value. Since the size of the gap 530 exceeds the available budget, it cannot be removed. Thus, no action can be taken for the gap 530, and so the analysis process proceeds to analyze a gap 536, which is the leftmost occurrence of the next smallest gap size of 12.

For the gap 536, no operations can be performed, since reducing the size of the gap 536 will not remove a unique gap value (since a value of 11 is already present), the gap is too large to remove, and there are no neighboring gaps for which the size of the gap could be reduced to create a longer run of a smaller size gap. Accordingly, the analysis can proceed to the next instance of gap size 12, gap 538. However, the analysis of the gap 538 is similar to that of the gap 536 and no operations can be performed.

Since no more gaps of size 12 are present, a gap 540 having the next largest gap size of 13 is analyzed. In this case, analyzing the gap 540 indicates that reducing the size of the gap 13 will not result in the removal of a unique gap length. However, reducing the size of the gap from 13 to 12 will create a longer consecutive run of gaps having length 12. Accordingly, this operation is performed to provide a fifth representation 544 of the sorted set of unique values 408. The performance of this operation reduces the budget from 6 to 5, as the reduction of the length of the gap 540 by one results in the introduction of another false positive result.

Looking at the gap 546 in the representation 544, it is determined that reducing the size of the gap from 17 to 12 would remove a distinct gap value. Since this introduces 5 false positive results, and the remaining budget is five, this operation can be performed to provide a sixth representation 560 of the sorted set of unique values 408, shown in FIG. 5B. Since gap 546 was the last remaining gap to be analyzed, the analysis of the initial set of sorted unique values 408 is complete.

FIG. 5B also illustrates a technique for compressing/encoding a representation of a set of sorted unique values, including after any processing to try and improve the compression of such set. In the specific example of FIG. 5B, the compression process is illustrated using the sixth representation 560.

FIG. 5B illustrates a dictionary 564 that can be used for dictionary compression. In general, the dictionary provides 564 values to be used to indicate a number of consecutive unique values and values used to indicate gap lengths. The same dictionary 564 is used for both purposes, and so a given value is included in the dictionary a single time whether it is included in one set or both sets, and regardless of the number of times it is present in any set.

In the example of FIG. 5B, it can be seen that there are two unique gap length values (11 and 12) and four unique values (1, 4, 6, and 20) used to represent consecutive unique values. Therefore, the set of values to be included in the dictionary includes six elements (1, 4, 6, 11, 12, and 20). The dictionary 564 will include an additional element indicating that run length encoding is used for a particular gap (or for a particular nSet value) in addition to dictionary encoding.

In the dictionary 564, values are encoded in binary (four bits). A value with a leading 0 is used to indicate run length encoding, where the remaining three bits indicate the length of a run. Note that this particular encoding scheme provides that the maximum run length that can be represented by a single value is 10. As shown, a minimum run length for dictionary compression is three, since a value of 0 does not make sense, a value of 1 indicates a single occurrence of a value, and not a run of multiple occurrences of the value. In this implementation, runs of only two consecutive occurrences of a value are also not compressed using run length encoding, as they do not result in significant compression. So, the dictionary 564 shows that a value that corresponds to the trailing bits of the dictionary value is the number encoded by the three trailing bits, plus three. So, "0000" is initially interpreted as run length encoding with a value of 0 indicated by the three trailing bits. However, when decoded, three is added to the 0, to provide a final run length of 3.

If longer runs needed to be represented, multiple smaller runs could be encoded, or the number of bits used for dictionary compression in the dictionary 564 can be increased. Bit representations of the values 8-115 are used to represent lengths of consecutive unique values or particular gap sizes (either an isolated gap or a gap that is part of a run of a given gap size).

While the use of binary numbers for compression has been described, dictionary or run length compression may be performed/encoded in another manner. The disclosed binary representation is beneficial because it easily allows for both run length encoding and dictionary compression in a single representation, and because binary values can be more compressible than other values.

As an example of how compression can be applied to the sixth representation 560 using the dictionary 564, consider the set of values 570. The set of values 570 corresponds to the values 572, where each value represents a number of consecutive unique values in a particular set of consecutive unique values (nSet values), followed by the values 574 representing the gap sizes. Note that the actual values in a set of ordered, unique values (such as the set 508) can be determined using the values 572, the values 574, and the starting/smallest value of the set of ordered, unique values (in this particular example, 5).

Each value of the set of values 570 is then encoded in order. For example, the first value in the set of values 570 is "1," and represents a single unique element. According to the dictionary 564, the value is encoded using the dictionary value of 1000 specified for the value of 1. Other values of the set of values 570 having an initial bit value of one can be encoded in the same manner.

Now, consider a situation where a run of values occurs (either in the values 572 or the values 574) in the set of values 570. In this case, two pieces of information are determined, the length of the run, and the value of the element in the run. The set 570 includes a single run of multiple values, in this case four consecutive occurrences of the value 12, all of which correspond to gap lengths 574. First, the dictionary 564 is used to indicate the use of run length encoding, and the length of the run. As explained above, a leading bit value of 0 is used to indicate run length encoding, and the remaining bits are used to indicate the length of the run.

According to construction of the dictionary 564, a minimum run length of three is provided. So, since the value 574 of 12 occurs in a run of 4, the three trailing bits of a dictionary value for the run length are set to encode 1 (since 1 plus three equals the run length of 4). Accordingly, the first dictionary value for the run of 4 values of 12 is 0001, indicating the length of the run. The dictionary 564 is then used as described above to encode the value represented in the run, 12, which according to the dictionary is 1100 (where the 1100 indicates a sequence/code in the dictionary, rather than having the bits providing a binary representation of the value 12).

A set of dictionary values 580 represents the final, compressed representation of the set of values 570, using both dictionary compression and run length encoding.

FIG. 5B also providers a set of dictionary values 584 corresponding to the sorted set of unique values 408, demonstrating how the process of analyzing and manipulating a representation of a gap filter can lead to a more compressed representation of the gap filter. The compressed representation 580 includes 9 values, while the set 584 includes 15 values.

Example 7—Example Reconstitution of Gap Filter from Compressed Representation

FIG. 6 illustrates how a compressed, or otherwise encoded, representation of a gap filter can be uncompressed, such as for use in evaluating whether one or more specified values are present in a dataset for which the gap filter is defined. FIG. 6 illustrates the set of dictionary values 580 as the set of values 604. The set of values 604 can be uncompressed and evaluated using the dictionary 564, shown as dictionary 608, and the starting value of the dataset. In the specific example discussed, the starting value is 5.

FIG. 6 illustrates a decoding sequence 616 for decoding the set of values using the dictionary 608. The first 6 values of the set of values 604 have a leading bit with the value of 1, and thus the four bit values can simply be replaced with the original values as indicated in a lookup operation for the dictionary 608. The seventh element of the set of values 604 has a leading bit with the value of 0, indicating that the run length compression is used. Based on the definition of the encoding process, it is known that, when run length compression is used, the first set of four bits represents the run length, while the second set of four bits represents the value represented in the runs.

In the first set of four bits, the trailing three bits indicate the run length have a value of 0001, or 1. However, the dictionary 608 indicates that 3 should be added to this decoded value, and so the actual run length is four. The second set of four bits can be decoded simply by performing a lookup operation of the dictionary 608, where the bits 1100 encode a value of 12, and so the two sets of four bits indicate a run of the value 12, where the length of the run is 4. The final value in the set of values 604 can simply be decoded using the dictionary 608.

By knowing the starting value of 5, a set of decompressed values 624 resulting from the sequence 616 can be used to create a representation 632 of the gap filter encoded by the values 604, corresponding to the gap filter 560 of FIG. 5B. It will be recalled that the values in the set of value 604, and thus the values in the set of decompressed values 624, are ordered by having values representing a number of consecutive unique values between gaps, ordered from left to right, followed by values representing gaps, where the gaps values are also ordered from left to right (in this particular example, from the smallest unique value to the largest unique value in the originally provided sorted set of unique values, such as the set 604).

It is also noted that it can be determined in the set of values 604, and the set of uncompressed values 624 produced therefrom, which values correspond to a number of consecutive unique values, and which correspond to gap lengths. That is, it is known that a given set of values starts with at least unique value (that is, the first value in the set could be a single unique value, a run of a single unique value, or a sequence of consecutive unique values, where some of those values may correspond to false positives), is followed by a gap, and then the set of values continues the pattern of a unique value (or "nSet" value) followed by a gap value, with the final value also being a unique value (nSet value). Based on this pattern, it is known that the number of values in a representation of a gap filter, such as the uncompressed values 624, will always contain exactly one more value representing one or more unique values (an nSet value) than the number of gaps in the gap filter.

Example 8—Example Use of Gap Filter

Figure 7B:
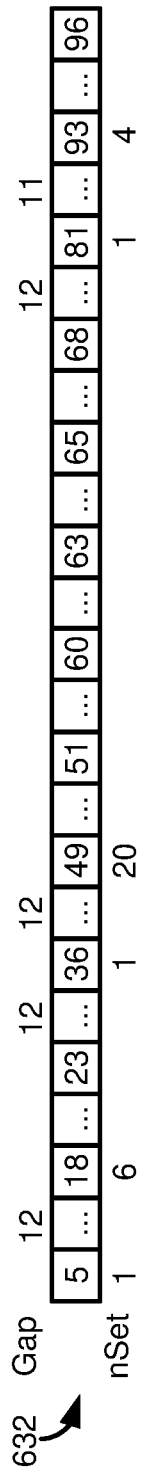
Figure 7B:
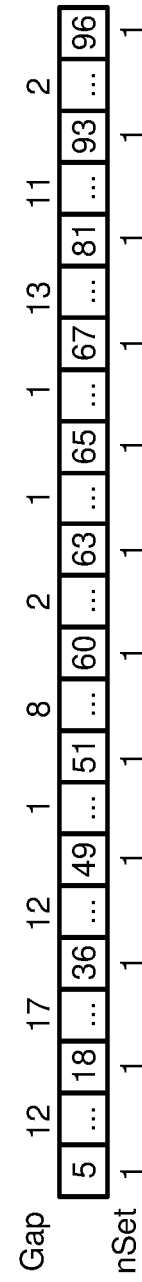

FIGS. 7A and 7B illustrate examples of how gap filters of the present disclosure can be used. In particular, the examples use the gap filter representation 632 of FIG. 6.

Example 9—Example Sorting Process Using Incrementing Offset Value

The present disclosure provides various sorting techniques that can be used in defining the disclosed gap filters, as well as in other applications. In particular, the sorting techniques can be used with other type of information, such as summary information, used to improve query evaluation, including using indexes or other types of filters, such as in database systems, including relational database systems.

For gap filters, and other uses, a list need not be strictly sorted. That is, rather than exchanging positions of values in a sequence during sorting, the values themselves can be manipulated such that a final list is ordered, with at least of the original numbers having been manipulated. This type of technique can be referred to as a "lazy sort." When the lazily sorted list is used, the use of the list can be defined to accommodate for the fact that the list is not strictly sorted, as will be further described.

Figure 8:
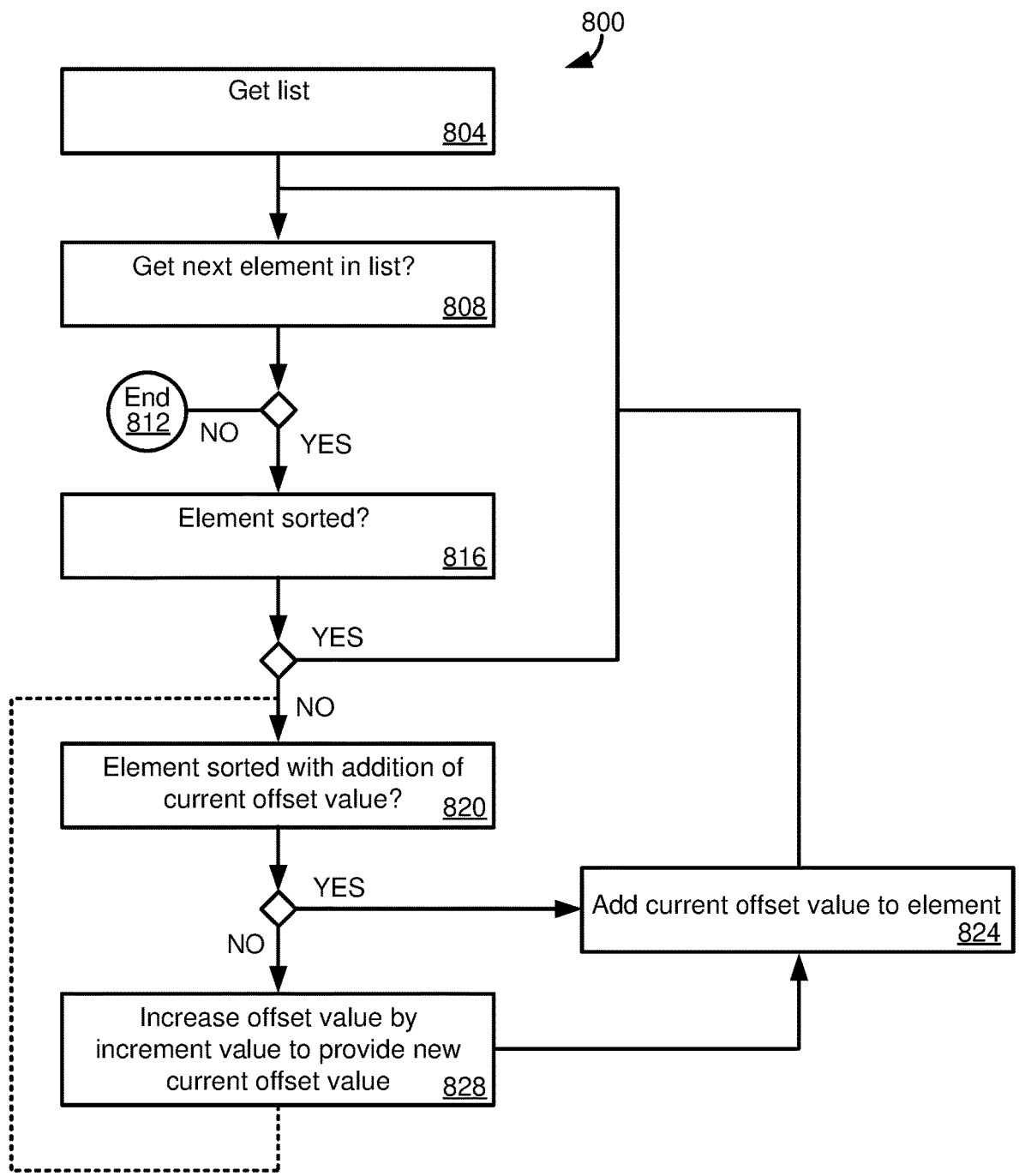
FIG. 8 is flowchart of a disclosed sorting technique where an incrementable value can be added to a set of values to be sorted to help sort the set of values.

FIG. 8 is a flowchart of a particular lazy sorting process 800 of the present disclosure. A list of values is obtained at 804. Typically, the list of values has at least some value that are not in a particular order, such as ordering values by ascending or descending values. However, the process 800 can be used with sorted lists, but such lists will not be altered by the process.

At 808, it is determined whether the list has remaining elements to be analyzed. That is, the list is typically analyzed in a particular order, such as from the beginning of the list towards the end of the list, or from the end of the list to the beginning of a list. The process 800 can end at 812 if it is determined at 808 that no remaining elements remain to be analyzed.

If elements remain to be analyzed, the next element is obtained and it is determined at 816 whether that element is sorted, such as, when sorting places values in order by ascending values, whether the value of the current element being analyzed is larger than the value of the previous element in the list. If the element is sorted, the process 800 can return to 808.

If the element is not sorted, it can be determined at 820 whether the current element would be sorted if a current offset value is added to the value of the element. For example, assume the current offset value is at 100. Consider a value of 18 that follows a value of 45. This case, the values are not sorted in an ascending order. However, the values are sorted if 100 were added to 18, since 118 is greater than 45. If the element would be sorted with the addition of the current offset value, the offset value is added to the value of the current element at 824 and then the process returns to 808. Typically, the offset value is selected to be larger than the difference between the maximum and the minimum elements in the list of values obtained at 804. For example, an offset value of 100 is useful if only values between 0-99 are expected.

If it is determined at 820 that the element is not sorted even if the current offset value were added to the element's value, the offset value can be increased at 828, such as by a specified increment rate (such as being increasing a current offset value by 100 every time the offset value is to be incremented) until the element becomes sorted with the addition of the current offset value. Typically, the increment rate is selected to be greater than the difference between the maximum and minimum elements in the list of values obtained at 804. The updated offset value is added to the value of the current element at 824 and the process 800 then returns to 808.

Note that in some cases the incrementing of an offset value may need to performed multiple times before a current element is sorted. That is, when the increment value is selected as described above, a single incrementation of the offset value will result in the new offset value placing the current element in sorted order. However, if the increment value is less than the difference between the maximum and minimum elements in the list of values, then multiple incrementations may need to be performed before the current element plus the offset value is in sorted order. This is shown by the alternative path in FIG. 8, where the process 800 can proceed from 828 to 820.

Example 10—Detailed Example of Lazy Sort Technique

FIGS. 9A-9C illustrate a particular example of the process 800. At 904, a set of values 908 is initially provided, to be sorted using the process 800. At, 910, the first element, having the value of 36, is placed in a set 912 whose elements will hold sorted values of the elements of the set of values 908. Since the value of 36 is the only element in the set of values 912, that set of values is sorted.

The next value in the set 908, 18, is analyzed. It can be seen that placing the value of 18 after the value of 36 in the set 912 would cause that set to no longer be sorted, as shown at step 924. Accordingly, a current offset value is updated, in this case from a starting value of 0 to a value of 100, and the value of 100 is added to the value of 18 to provide an updated value of 118. As shown at step 928, the set 912 is ordered with the manipulation of the value of 18, since 118 is larger than 36.

The next value in the set 908, 51, is then evaluated. As shown at step 932, placing the value of 51 in the set 912 would cause its values to be out of order, since 51 is less than 118. It is then determined whether adding the current offset value of 100 would result in an ordered set 912. In this case it would, since 151 is greater than 118. Thus, step 936 illustrates the set 912 after manipulating the value of 51. This update of the set did not require an increase in the offset value, which remains 100.

Steps 940, 942, and 944, for the values of 60, 65, and 67 are analogous to step 936. That is, these elements would be unsorted if placed in the set 912 without alteration, but are sorted with the addition of the current offset value of 100. However, now consider the element with the value of 49 in the set 904. Placing the element in the set 912 would result in the set being out of order, since 49 is less than 167, as shown at 946. However, the element is still out of order even with the addition of the current offset value of 100, since 149 is still less than 167. Accordingly, the current offset value is increased from 100 to 200, and then added to provide a value of 249. Placing 249 in the set 912 results in the set being in order, as shown at step 948.

The next value in the set 904, 96, is in order after the addition of the current offset value of 200, as shown at step 952. However, the next value in the set 904, 63, is not in order with respect to the set 912, and would not be in order even with the addition of the current offset value, since 263 is still less than 296. Accordingly, the current offset value is updated from 200 to 300, added to 63 and the resultant value of 363 is placed in the set 912, as shown at 954. The 912 is in order, since 363 is greater than 296.

Turning to the next value in the set 904, 5, that value would not be in order if placed in the set 912, nor would it be in order if the current offset value were added, since 305 is less than 363. Thus, the offset value is increased once again from 300 to 400, added to the value of 5, which is then added to the set 912 as shown at step 956. The set 912 remains ordered, since 405 is greater than 363.

Step 960 shows the results of the next operation, where adding the current offset value of 400 to the next element of the set 904, 93, results in the set 912 being ordered. Turning to the last element of the set 904, having a value of 81, the element would not provide an ordered set 912 even after adding the current offset value of 400, since 481 is less than 493. So, the offset value is increased a final time, from 400 to 500, added to the element, and the updated element value added to the set 912, as shown in step 964. The set 912 is ordered, since 581 is greater than 493.

As described above, an ordered set of elements 970 resulting from applying the process 800 to the set of elements provides ordered elements, superficially, but at least a subset of the elements may be unordered. That is, for example, even though values 36 and 118 appear ordered in the set 970, the actual values represented by those elements, 36 and 18, remain unordered.

However, processes using a lazily sorted set of values can be defined to account for the facts that underlying values may not be fully sorted. In the example of searching the ordered set of elements 970 for a particular value, the particular value can be searched using its ordered value, and the original value combined with each distinct offset value up to the final increment value. That is, for example, if the final increment value is 500, and the increment size is 100, it is known that offset values of 100, 200, 300, 400, and 500 are used in the set 970. Thus, in order to determine whether a given value is present in the set 970, the set can be searched for the value, the value plus 100, and so on, up the value plus 500, the maximum off set value used based on the final increment value (and knowing the increment rate).

It can be seen that using the lazy sort technique can require fewer computing resources to produce a sorted list than other sort techniques, but can result in the need for multiple queries. Particularly for searches on less frequently accessed datasets, or with less frequently used conditions, the use of the lazy sorting technique can reduce the computational expense of providing indexing or filtering functionality, such as with a gap filter. While extra computational costs may be incurred when it is desired to determine whether a particular value is present in a particular dataset, these costs can overall be lower than performing a strict sort initially. In addition, in least some cases, performing multiple queries of a gap filter created using lazily sorted data can be performed in parallel.

Example 11—Example Stream Sort Technique

The present disclosure provides another sorting technique, referred to as a stream sort, which can be used in conjunction with the disclosed gap filters, with indexes, filters, or other types of summary information more generally, as well as in other applications. The stream sort technique can optionally be combined with the lazy sort technique discussed in Examples 9 and 10.

Figure 10:
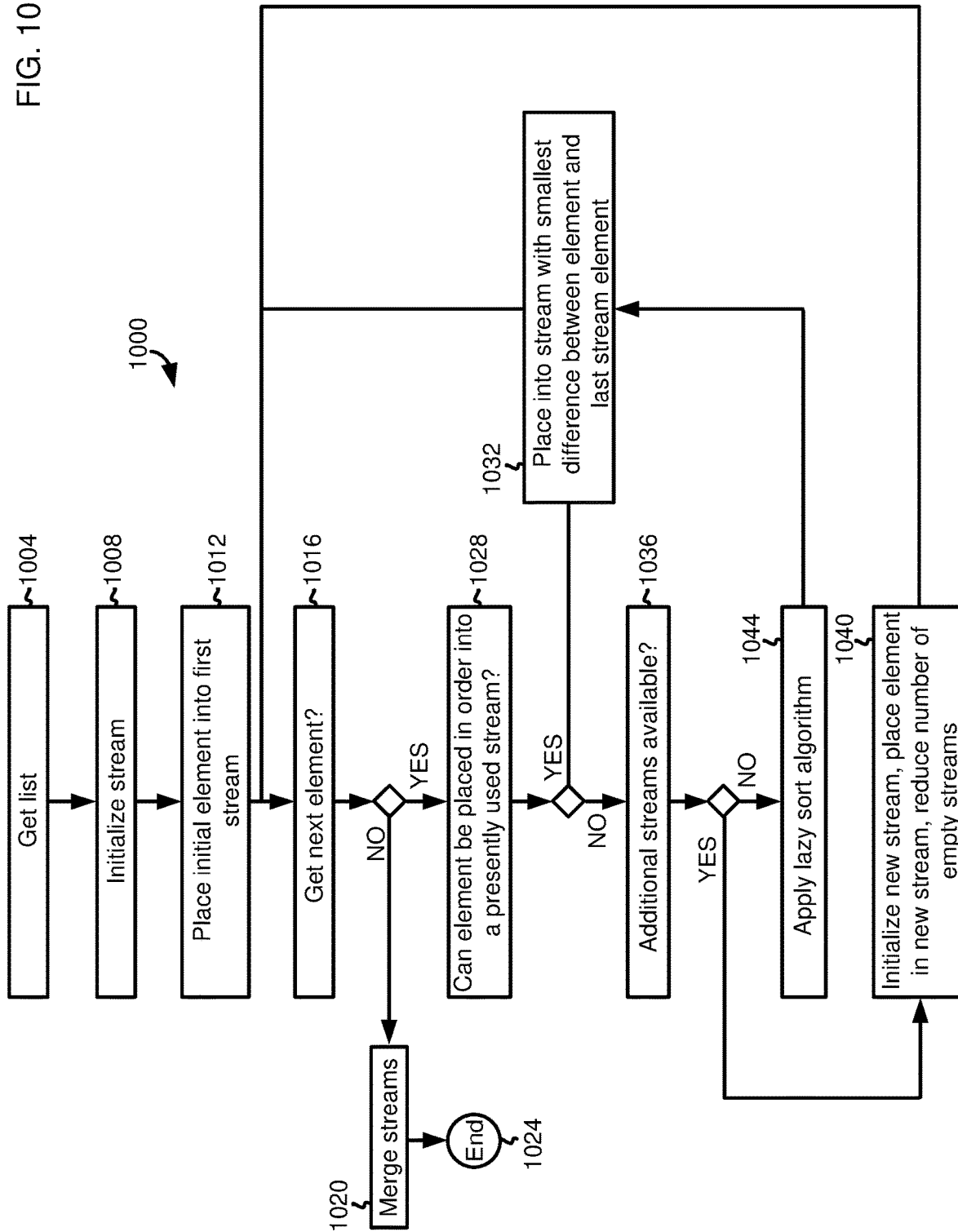
FIG. 10 is a flowchart of another disclosed sorting process, where values can be sorted into different streams to sort a given dataset.

FIG. 10 illustrates a flowchart for an example process 1000 for conducting a stream sort. A list (or other type of set) of elements is received at 1004. At 1008, a first stream is initialized, and the first element of the set is placed in the first stream at 1012. It is determined at 1016 whether the set has additional elements that have not yet been sorted. If not, any streams that have been populated are merged at 1020, and the process 1000 ends at 1024.

If additional elements remain to be sorted, it is determined at 1028 if the next element can be placed in order into a presented populated stream. If so, at 1032, the element is placed into the stream where the element has the smallest difference between its value and the value of the last element currently in the stream. For example, consider that a value of 65 could be placed into a stream with a last value of 57 or another stream with a last value of 34. Since the difference between 65 and 57 is smaller than the difference between 65 and 34, the value of 65 is placed in the stream with the value of 57. The process 1000 then returns to 1016.

If it is determined at 1028 that the current element cannot be placed in order in an existing stream, it is determined at 1036 whether additional, unused streams are available. If so, at 1040, a new stream can be initialized, and the element placed in the new stream. In some cases, the number of available streams can be restricted. In this case, the number of unused streams is reduced by one, and the process 1000 returns to 1016.

If it is determined at 1036 that no more unused streams are available, the process 1000 can employ the lazy sorting technique FIG. 8 at 1044. Namely, an offset value can be added to the current element, and then the process 1000 can proceed to 1032.

Example 12—Detailed Example of Stream Sort Technique

FIGS. 11A-11D provide a specific example of the process 1000 of FIG. 10. The example uses an initial set of unsorted (that is, while the set is unsorted overall, particular subsets of the set may be sorted) values 1104. In this example, four streams 1108 (shown as streams 1108a-1108d) are available, and are initially empty, as shown at step 1112.

The first value of the set 1104, 36 is placed in the first stream 1108a at step 1114. The second value of the set 1104, 18, is less than 36. Thus, assuming that the sorting places values in the set 1104 in ascending order, placing the second value in the stream 1108a would cause that stream to be out of order/unsorted. Accordingly, the value of 18 is placed in the second stream 1108b at step 1116.

For the third value of 51, it can be seen that 51 is larger than both 36 and 18. Thus, the value of 51 could be potentially placed in either stream 1108a or 1108b. According to the process 1000, the value of 51 is placed in the stream 1108 where it has the smallest difference from the last value in a given stream. Here, the difference between 51 and 36 is less than the difference between 51 and 18, and so the value of 51 is placed in the stream 1108a at step 1118.

Turning to FIG. 11B, the next values 60, 65, and 67 are analyzed and processed in the same way as the value of 51. That is, each of these values is larger than a last value in the currently used streams 1108a, 1108b, but the differences between the values and the last value of the streams is smallest for stream 1108a. Thus, values 60, 65, and 67 are progressively placed in the stream 1108a at steps 1120, 1122, and 1124. While the next value, 49, is too small to be placed in stream 1108a, it can be placed in stream 1108b at step 1126.

With reference now to FIG. 11C, turning to the next value of the set 1104, 96, again it can be seen that 96 can be placed in either stream 1108a or stream 1108b. However, the difference between 96 and the last values of these streams is less for stream 1108a, and so 96 is placed in stream 1108a at step 1128. At step 1130, the next value in the set 1104, 63, is placed in the stream 1108b, since it is in order in that stream, and is too small to be placed in the stream 1108a.

The next value in the set 1104, 5, is too small to be placed in the stream 1108a or the stream 1108b. However, additional unused streams are available, and so the value of 5 is placed in the stream 1108c at step 1132. At step 1134, the next set value, 93, is placed in stream 1108b, since it is too small for stream 1108a, and the difference between the last values in stream 1108b and 1108c is smallest for stream 1108b. Finally, the last value of the set 1104, 81, is placed in the stream 1108c at step 1136, since stream 1108c is the only stream in which the value can be placed and maintain the order of the stream.

Note that in this example, not all of the streams 1108 were used, and so it was not necessary to also use the disclosed lazy sort technique. However, consider a scenario where the last value of the set 1104 was 3 instead of 81, and that only three streams were available. In this case, the value of 3 cannot be placed in streams 1108a-1108c, and no additional streams are available. Assume, as with the earlier example of the lazy sort technique, that the offset value starts at 0 and increases 100 each time it is incremented. If this was the first use of the lazy sort technique, the value of 100 would be added to 3 to provide a value of 103. Now, the value of 103 could be placed in any of the streams 1108a-1108c. However, the difference between 103 and the last element in the streams 1108a-1108c is the least for stream 1108a, and so 103 would be placed in stream 1108a. Since the lazy sort technique was used, when a gap filter created using the final set of sorted values is queried, a query would be performed for any query value provided, and another query could be performed for the query value plus the offset value of 100.

Returning to FIG. 11D, the final streams 1108a-1108c are merged to provide a final sorted set 1150. In a specific example, a gap filter can be constructed, and optionally compressed, using the sorted set 1150.

Example 13—Example Intersection Determination

While disclosed sorting techniques can be used in many different scenarios, including with the gap filters of the present disclosure, another useful scenario is determining intersections between two or more collections, such as between two or more sets or lists. Intersection determination is used in a variety of computer-implemented processes, including query optimization, set operations, duplicate removal, relational joins, filtering, data analysis, data validation, privacy and security, recommendation systems, and constraint validation in various database and data-related applications. However, sorting, whether for these uses or others, can be computationally expensive. For example, many sorting algorithms have O(n log n) complexity, and so the resources needed to sort a collection can increase significantly as the number of elements in the collection increases. In many of the processes described above, very large collections may be present. For example, relational joins can involve millions of records.

A method of using disclosed sorting techniques can be similar, in at least some ways, to processing queries using gap filters. That is, for example, if lazy sorting is used, either alone or together with stream sorting, an intersection determination process can include operations for determining whether an intersection may include false positive values resulting from the use of offset values.

Figure 12:
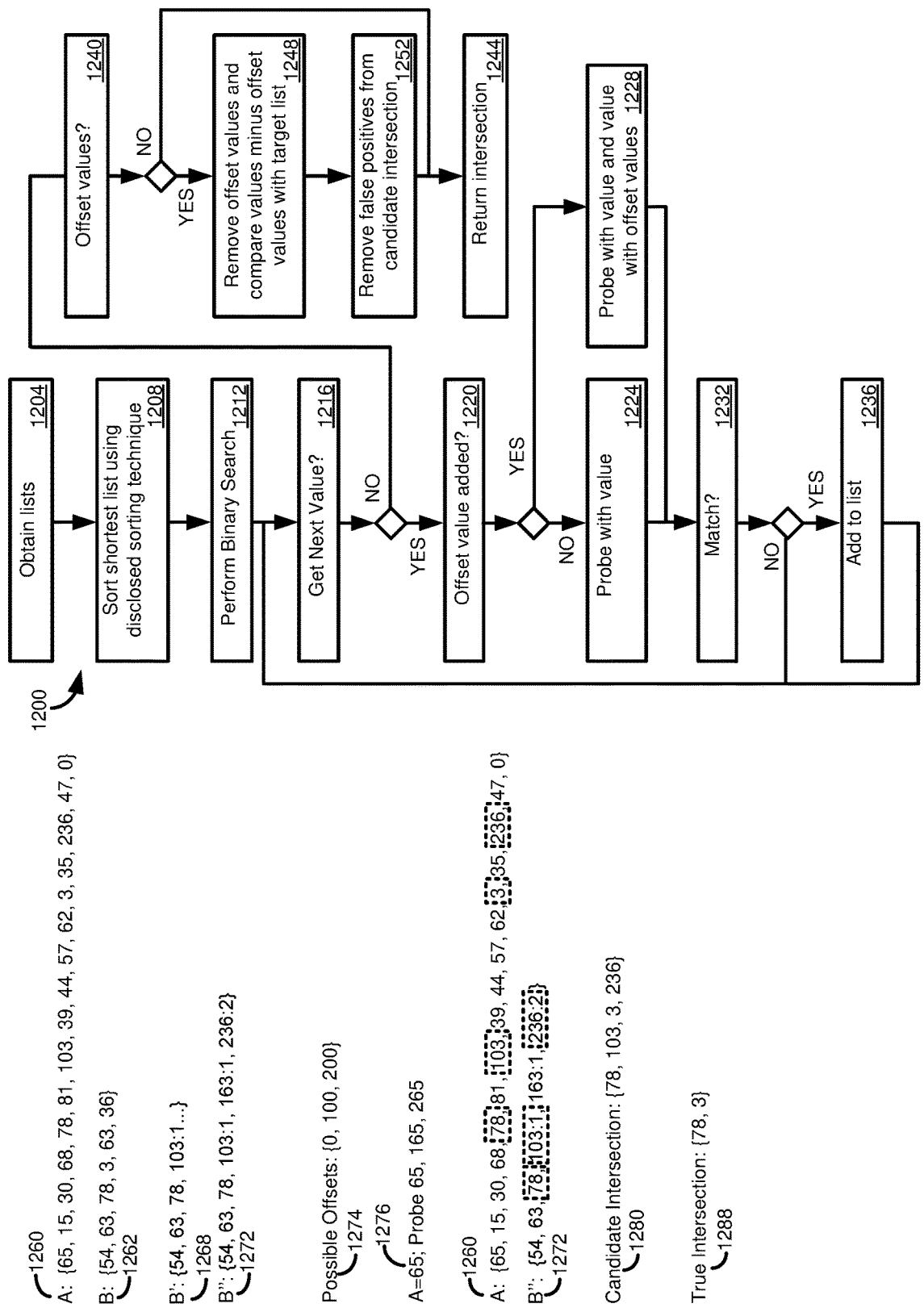
FIG. 12 provides a flowchart of a process of determining an intersection of two data collections using a disclosed lazy sort technique, as well as a specific example of such process.

FIG. 12 illustrates an intersection determination process 1200 using disclosed sorting techniques, as well as a concrete example of this process. Looking first at the process 1200, at 1204, two or more lists are obtained. While the term list is used for convenience of presentation, it should be understood that the process 1200 can be used with other specific types of collections, such as sets. The shorter list (the list having the smaller number of elements) is sorted using a disclosed technique at 1208. In particular, the shortest list is sorted using a disclosed lazy sort technique, alone or in combination with stream sorting. The process 1200 can also be used with lists sorted with the disclosed stream sorting process, where the sorting does not also use the lazy sort technique. In this case, operations of the process 1200 related to false positive values or offset values can be omitted.

A binary search process is initiated at 1212. In the binary search process, the sorted, shorter list is probed using values in the longer list. The sorted nature of the sorted list allows the binary search technique to be performed. Although the process 1200 is described for a binary search algorithm, disclosed intersection determination processes and sorting techniques can be used with other types of search processes, including interpolation search, exponential search, Fibonacci search, jump search, ternary search, hash table lookups, range queries, and interval tree searches.

It is determined at 1216 whether additional values are to be searched. If so, the process proceeds to 1220. At 1220, it is determined whether an offset value was added to a particular value of the sorted list as part of lazy sorting. If not, the probing is carried out using only the current value of the larger list at 1224. If it is determined at 1220 that the particular value of the sorted list was increased by an offset value as part of searching, the probing is carried out using the value of the larger list, as well as that value plus all offset values up to a maximum offset value used during the sort technique at 1228.

After either 1224 or 1228, the process 1200 determined at 1232 whether a probe value matches an element of the sorted list. If not, the process 1200 returns to 1216. If so, the probe value is added to a list corresponding to a candidate intersection at 1236, and then the process 1200 returns to 1216.

If it is determined at 1216 that no more elements of the larger list remain to be analyzed, it is determined at 1240 whether any elements of the candidate intersection correspond to values with added offset values. If not, the intersection can be returned (such as being the output of a function in computer code) at 1244.

If it is determined at 1240 that one or more values in the candidate intersection correspond to values with an added offset value, the offset value is subtracted from the value in the candidate intersection at 1248. Also at 1248, the resultant values from removing the offset values are compared with the larger, probe list at 1252. False positives are removed from the candidate intersection at 1256. That is, if there is no longer a match between the probe (larger) list and the shorter list after the removal of the offset value, the element corresponds to a false positive, since the "real"/"true" value is not both lists. The updated list then corresponds to the intersection, which is returned at 1244.

FIG. 12 also provides a specific example of the process 1200, using data sets 1260 and 1262. According to the process 1200, the smaller data set, data set 1262, is selected to be sorted. The sorting in this example uses the lazy sort technique, without also using the stream sort technique. The sort can be performed using the combination of both techniques, and can result in fewer false positive values to be pruned, since incrementing an offset value is typically performed less frequently when stream sorting is used.

Data set 1268 corresponds to a partially sorted version of the smaller data set 1262. In this case, it can be seen that the first three elements of the data set 1262 are sorted in the data set 1268. However, when the value of 3 is encountered, the offset value of 100 is added to the value to provide an incremented value of 103, which is then in sorted order in the data set 1268. The sorting process continues in a similar manner to provide the final, sorted version 1272 of the smaller list 1262. It can be seen that the offset value was further incremented from 100 to 200 during sorting. Thus, FIG. 12 depicts a set 1274 of possible offset values.

Now, consider a probe of the sorted set 1272 using the first value, 65, of the larger set 1260. When a probe is conducted, since the sorted set includes incremented values (indicated by a value, followed by a colon, and then another value, wherein the colon indicates an incremented value and the value after the colon indicates a number of times the offset value was incremented), the value of 65 will be used in the probe as well as the values 165 and 265, as shown at 1276, since the value of 65 could appear as the original value or as the combined with either of the two offset values as a result of the lazy sort process. Similar probes are conducted for the remaining values of the larger set 1260.

The probing results in a candidate intersection 1280. Note that the candidate intersection 1280 includes two values for the probe value 3 of the larger set 1260, since the value of 3 could be represented in the sorted set 1272 as 3, 103, or 203.

According to the process 1200, the values in the candidate intersection 1280 are compared with the values in the sorted set 1272 and the values in the larger set 1260 to determine whether the values in fact match. In the case of 78, both sets contain the value and so it is a true match. Looking at the value of 103, it can be determined that the value of 103 in the sorted set 1272 actually represents the value of 3. Since the sorted set 1272 does not contain the actual value of 103, 103 is a false positive and is removed from the candidate intersection 1280.

Turning to the value of 3 in the larger set 1260, 3 is a true match with the sorted set 1272, since the value of 103 in the sorted set is a representation of the value of 3. So, 3 remains in the candidate intersection 1280. Finally, the value of 236 is considered. While the sorted set 1272 includes the value of 236, it is really a representation of the value 36. Since the sorted set 1272 does not include an actual value of 236, that value is a false positive, and is removed from the candidate intersection 1280. The process results in the final, true intersection 1288.

Example 14—Example Operations

Figure 13:
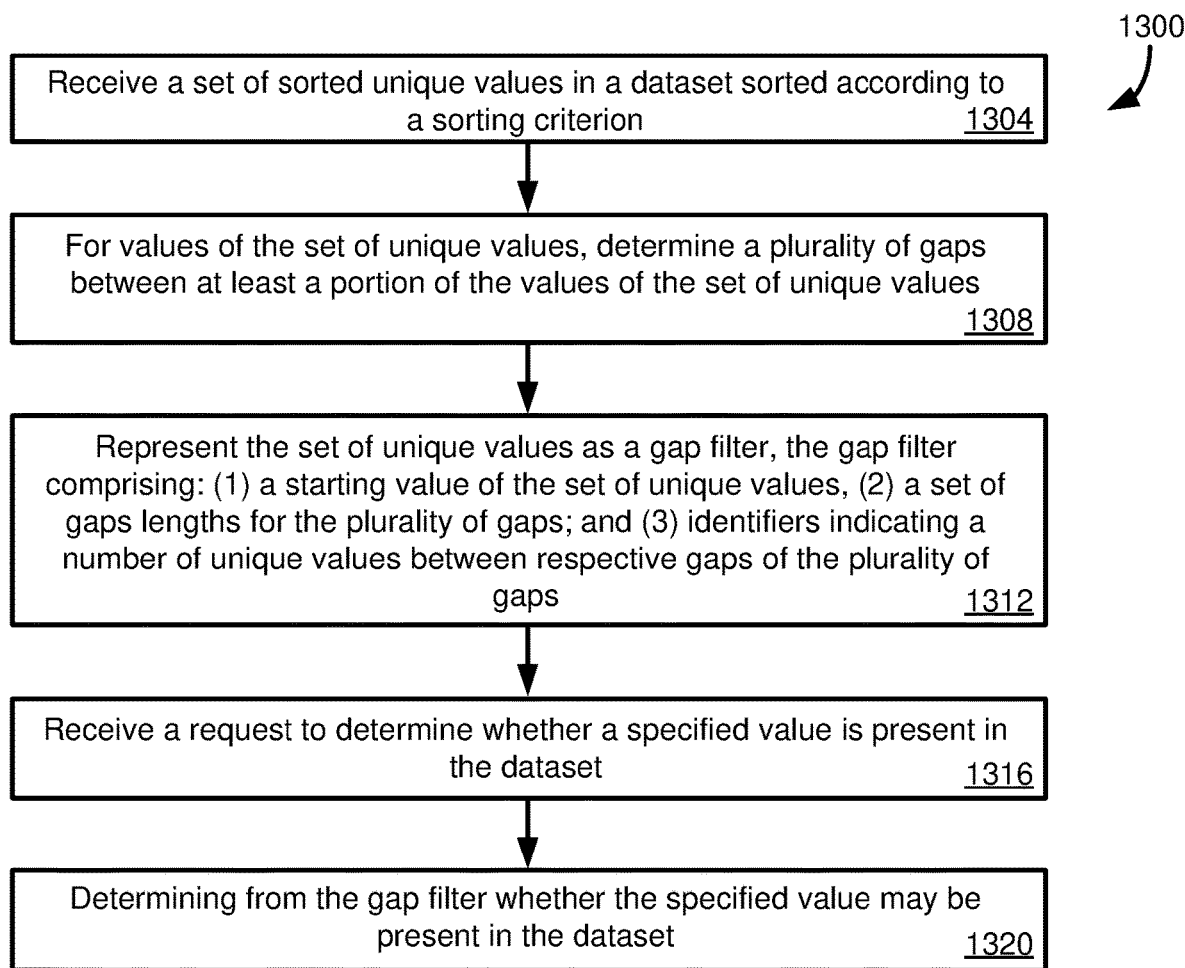
FIG. 13 is a flowchart of a process of defining a gap filter and using the gap filter to determine whether a specified value may be present in a dataset for which the gap filter is defined.

FIG. 13 provides a flowchart of a process 1300 of defining a gap filter and using the gap filter to determine whether a specified value may be present in a dataset for which the gap filter is defined. At set of sorted unique values in a dataset sorted according to a sorting criterion is received at 1304.

For values of the set of unique values, at 1308, a plurality of gaps between at least a portion of the values of the set of unique values are determined. At 1312, the set of unique values is represented as a gap filter, the gap filter comprising: (1) a starting value of the set of unique values, (2) a set of gaps lengths for the plurality of gaps; and (3) identifiers indicating a number of unique values between respective gaps of the plurality of gaps.

A request is received at 1316 to determine whether a specified value is present in the dataset. At 1320, it is determined from the gap filter whether the specified value may be present in the dataset.

Figure 14A:
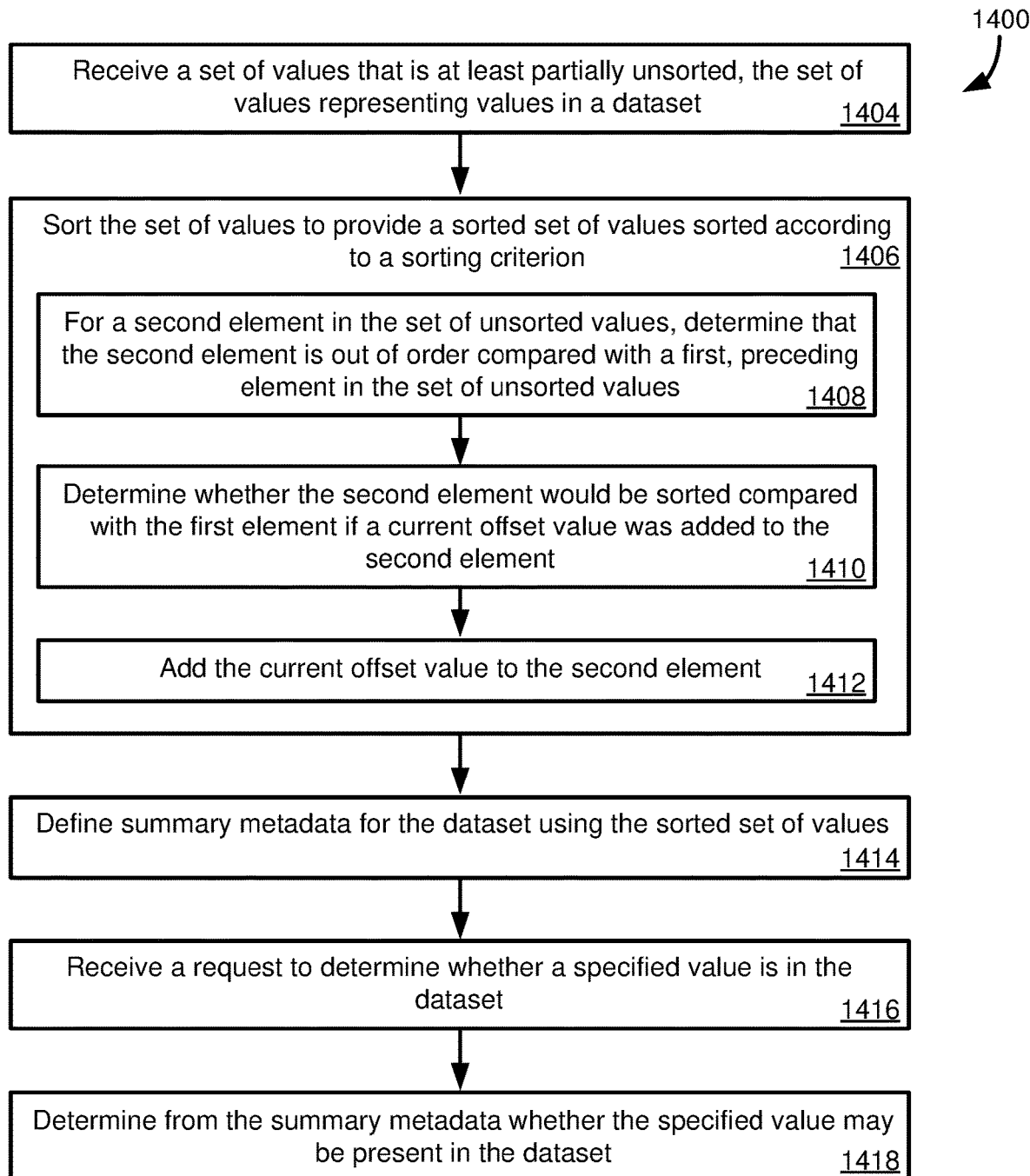
FIG. 14A is a flowchart of a process of defining summary information useable to determine whether a particular value may be present in a data set, including sorting a set of values for use in preparing the summary information by adding offset values to certain elements of the dataset to order the dataset.

FIG. 14A provides a flowchart of a process 1400 of defining summary information useable to determine whether a particular value may be present in a data set, including sorting a set of values for use in preparing the summary information by adding offset values to certain elements of the dataset to order the dataset. At 1404, a set of values is received that is at least partially unsorted, the set of values representing values in a dataset.

The set of values is sorted at 1406 to provide a sorted set of values sorted according to a sorting criterion. The sorting includes, at 1408, for a second element in the set of unsorted values, determining that the second element is out of order compared with a first, preceding element in the set of unsorted values. At 1410, it is determined whether the second element would be sorted compared with the first element if a current offset value was added to the second element. The current offset value is added to the second element at 1412.

Summary metadata for the dataset is defined at 1414 using the sorted set of values. At 1416, a request is received to determine whether a specified value is in the dataset. From the summary metadata, it is determined at 1418 whether the specified value may be present in the dataset.

Figure 14B:
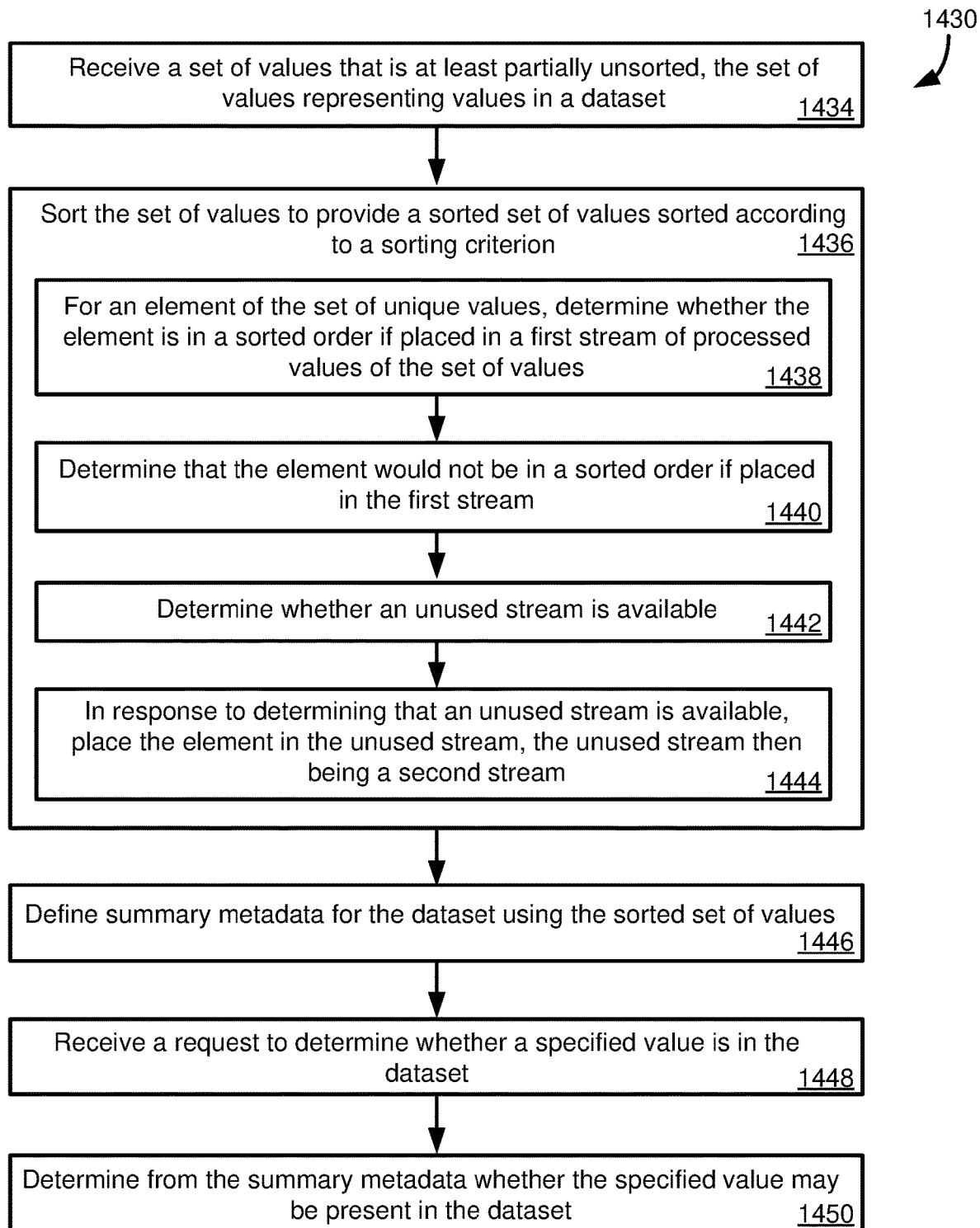
FIG. 14B is a flowchart of a process of defining summary information useable to determine whether a particular value may be present in a data set, including sorting a set of values for use in preparing the summary information by sorting elements of the set of values into data streams.

FIG. 14B provides a flowchart of a process 1430 of defining summary information useable to determine whether a particular value may be present in a data set, including sorting a set of values for use in preparing the summary information by sorting elements of the set of values into data streams. At 1434, a set of values is received that is at least partially unsorted, the set of values representing values in a dataset. The set of values is sorted at 1436 to provide a sorted set of values sorted according to a sorting criterion. The sorting includes, at 1438, for an element of the set of unique values, determining whether the element is in a sorted order if placed in a first stream of processed values of the set of values. It is determined at 1440 that the element would not be in a sorted order if placed in the first stream. At 1442, it is determined whether an unused stream is available. In response to determining that an unused stream is available, at 1444, the element is placed in the unused stream, the unused stream then being a second stream.

Summary metadata for the dataset is defined at 1446 using the sorted set of values. At 1448, a request is received to determine whether a specified value is in the dataset. From the summary metadata, it is determined at 1450 whether the specified value may be present in the dataset.

Figure 14C:
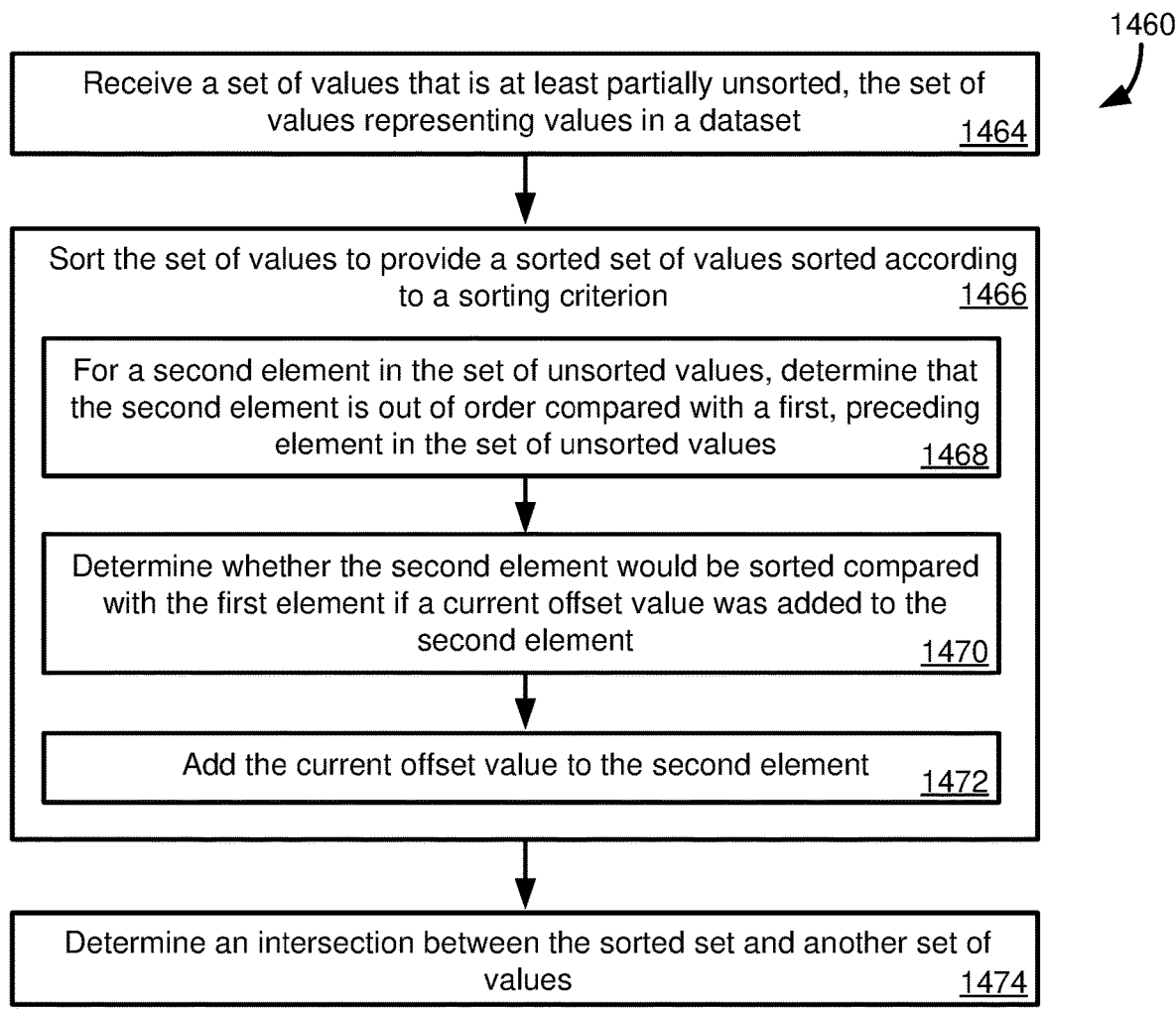
FIG. 14C is a flowchart of a process of sorting a dataset for use in determining an intersection with another dataset.

FIG. 14C provides a flowchart of a process 1460 of sorting a dataset for use in determining an intersection with another dataset. At 1464, a set of values is received that is at least partially unsorted, the set of values representing values in a dataset. The set of values is sorted at 1466 to provide a sorted set of values sorted according to a sorting criterion. The sorting includes, at 1468, for a second element in the set of unsorted values, determining that the second element is out of order compared with a first, preceding element in the set of unsorted values. At 1470, it is determined whether the second element would be sorted compared with the first element if a current offset value was added to the second element. The current offset value is added to the second element at 1472. An intersection between the sorted set and another set of values is determined at 1474.

Example 15—Computing Systems

Figure 15:
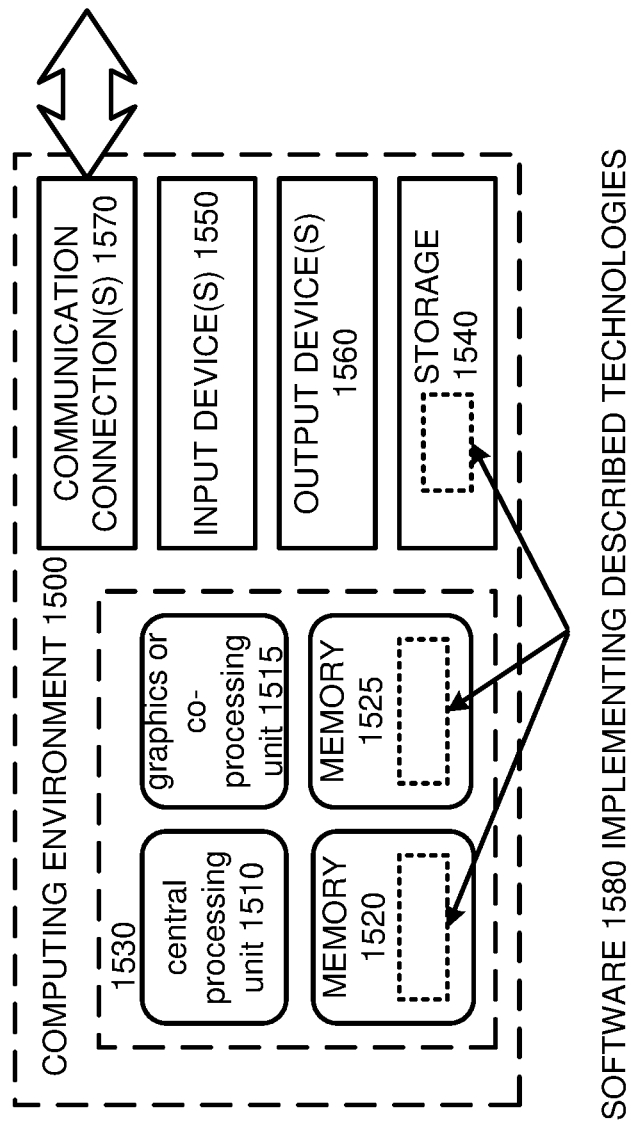
FIG. 15 is a diagram of an example computing system in which some described embodiments can be implemented.

FIG. 15 depicts a generalized example of a suitable computing system 1500 in which the described innovations may be implemented. The computing system 1500 is not intended to suggest any limitation as to scope of use or functionality of the present disclosure, as the innovations may be implemented in diverse general-purpose or special-purpose computing systems.

With reference to FIG. 15, the computing system 1500 includes one or more processing units 1510, 1515 and memory 1520, 1525. In FIG. 15, this basic configuration 1530 is included within a dashed line. The processing units 1510, 1515 execute computer-executable instructions, such as for implementing a database environment, and associated methods, described in Examples 1-14. A processing unit can be a general-purpose central processing unit (CPU), a processor in an application-specific integrated circuit (ASIC), or any other type of processor. In a multi-processing system, multiple processing units execute computer-executable instructions to increase processing power. For example, FIG. 15 shows a central processing unit 1510 as well as a graphics processing unit or co-processing unit 1515. The tangible memory 1520, 1525 may be volatile memory (e.g., registers, cache, RAM), non-volatile memory (e.g., ROM, EEPROM, flash memory, etc.), or some combination of the two, accessible by the processing unit(s) 1510, 1515. The memory 1520, 1525 stores software 1580 implementing one or more innovations described herein, in the form of computer-executable instructions suitable for execution by the processing unit(s) 1510, 1515.

A computing system 1500 may have additional features. For example, the computing system 1500 includes storage 1540, one or more input devices 1550, one or more output devices 1560, and one or more communication connections 1570. An interconnection mechanism (not shown) such as a bus, controller, or network interconnects the components of the computing system 1500. Typically, operating system software (not shown) provides an operating environment for other software executing in the computing system 1500, and coordinates activities of the components of the computing system 1500.

The tangible storage 1540 may be removable or non-removable, and includes magnetic disks, magnetic tapes or cassettes, CD-ROMs, DVDs, or any other medium which can be used to store information in a non-transitory way, and which can be accessed within the computing system 1500. The storage 1540 stores instructions for the software 1580 implementing one or more innovations described herein.

The input device(s) 1550 may be a touch input device such as a keyboard, mouse, pen, or trackball, a voice input device, a scanning device, or another device that provides input to the computing system 1500. The output device(s) 1560 may be a display, printer, speaker, CD-writer, or another device that provides output from the computing system 1500.

The communication connection(s) 1570 enable communication over a communication medium to another computing entity, such as another database server. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

The innovations can be described in the general context of computer-executable instructions, such as those included in program modules, being executed in a computing system on a target real or virtual processor. Generally, program modules or components include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing system.

The terms "system" and "device" are used interchangeably herein. Unless the context clearly indicates otherwise, neither term implies any limitation on a type of computing system or computing device. In general, a computing system or computing device can be local or distributed, and can include any combination of special-purpose hardware and/or general-purpose hardware with software implementing the functionality described herein.

For the sake of presentation, the detailed description uses terms like "determine" and "use" to describe computer operations in a computing system. These terms are high-level abstractions for operations performed by a computer, and should not be confused with acts performed by a human being. The actual computer operations corresponding to these terms vary depending on implementation.

Example 16—Cloud Computing Environment

Figure 16:
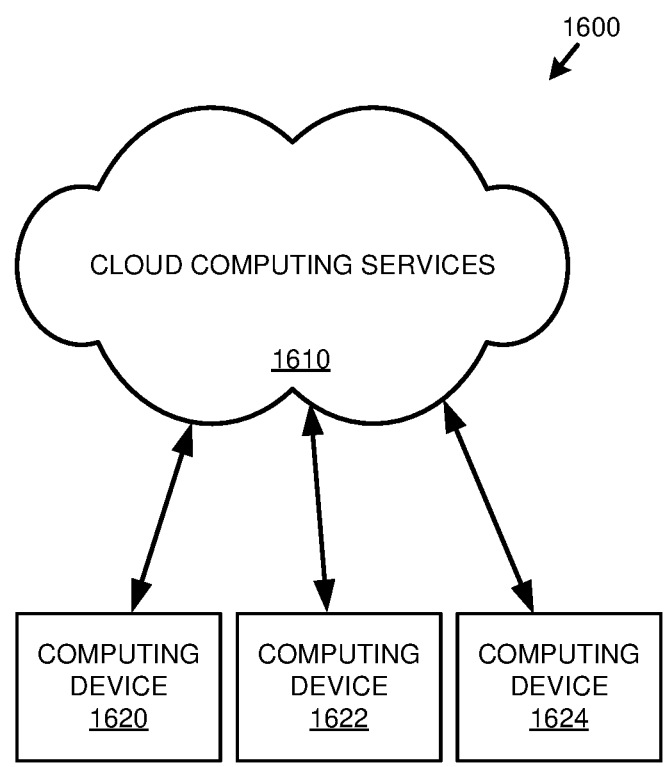
FIG. 16 is an example cloud computing environment that can be used in conjunction with the technologies described herein.

FIG. 16 depicts an example cloud computing environment 1600 in which the described technologies can be implemented. The cloud computing environment 1600 comprises cloud computing services 1610. The cloud computing services 1610 can comprise various types of cloud computing resources, such as computer servers, data storage repositories, networking resources, etc. The cloud computing services 1610 can be centrally located (e.g., provided by a data center of a business or organization) or distributed (e.g., provided by various computing resources located at different locations, such as different data centers and/or located in different cities or countries).

The cloud computing services 1610 are utilized by various types of computing devices (e.g., client computing devices), such as computing devices 1620, 1622, and 1664. For example, the computing devices (e.g., 1620, 1622, and 1624) can be computers (e.g., desktop or laptop computers), mobile devices (e.g., tablet computers or smart phones), or other types of computing devices. For example, the computing devices (e.g., 1620, 1622, and 1624) can utilize the cloud computing services 1610 to perform computing operators (e.g., data processing, data storage, and the like).

Example 17—Implementations

Although the operations of some of the disclosed methods are described in a particular, sequential order for convenient presentation, it should be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions or a computer program product stored on one or more computer-readable storage media, such as tangible, non-transitory computer-readable storage media, and executed on a computing device (e.g., any available computing device, including smart phones or other mobile devices that include computing hardware). Tangible computer-readable storage media are any available tangible media that can be accessed within a computing environment (e.g., one or more optical media discs such as DVD or CD, volatile memory components (such as DRAM or SRAM), or nonvolatile memory components (such as flash memory or hard drives)). By way of example and with reference to FIG. 15, computer-readable storage media include memory 1520 and 1525, and storage 1540. The term computer-readable storage media does not include signals and carrier waves. In addition, the term computer-readable storage media does not include communication connections (e.g., 1570).

Any of the computer-executable instructions for implementing the disclosed techniques, as well as any data created and used during implementation of the disclosed embodiments, can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C++, Java, Perl, JavaScript, Python, Ruby, ABAP, Structured Query Language, Adobe Flash, or any other suitable programming language, or, in some examples, markup languages such as html or XML, or combinations of suitable programming languages and markup languages. Likewise, the disclosed technology is not limited to any particular computer or type of hardware. Certain details of suitable computers and hardware are well known and need not be set forth in detail in this disclosure.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and sub combinations with one another. The disclosed methods, apparatus, and systems are not limited to any specific aspect or feature or combination thereof, nor do the disclosed embodiments require that any one or more specific advantages be present, or problems be solved.

The technologies from any example can be combined with the technologies described in any one or more of the other examples. In view of the many possible embodiments to which the principles of the disclosed technology may be applied, it should be recognized that the illustrated embodiments are examples of the disclosed technology and should not be taken as a limitation on the scope of the disclosed technology. Rather, the scope of the disclosed technology includes what is covered by the scope and spirit of the following claims.

What is claimed is:

1. A computing system comprising:
    at least one memory;
    one or more hardware processor units coupled to the at least one memory; and
    one or more computer readable storage media storing computer-executable instructions that, when executed, cause the computing system to perform operations comprising:
        receiving a set of sorted unique values in a dataset sorted according to a sorting criterion, the dataset being data stored in at least one computer-implemented data structure;
        for values of the set of sorted unique values, determining a plurality of gaps between at least a portion of the values of the set of sorted unique values;
        representing the set of unique values as a gap filter, the gap filter comprising: (1) a starting value of the set of sorted unique values, (2) a set of gap lengths for the plurality of gaps, wherein a gap length corresponds to a number of consecutive unique values that are represented as not present in the dataset; and (3) identifiers indicating a number of consecutive unique values that are represented as present in the dataset between a unique value corresponding to an ending value of a first gap and a starting value of a second gap;
        receiving a computer-implemented data retrieval request requesting information in the dataset, the computer-implemented data retrieval request specifying at least one value;
        in response to the computer-implemented data retrieval request, receiving a request to determine whether the at least one value may be present in the dataset;
        determining from the gap filter whether the at least one value may be present in the dataset; and
        when the gap filter indicates the at least one value may be present in the dataset, loading at least a portion of the dataset from the at least one computer-implemented data structure for use in processing the computer-implemented data retrieval request, wherein the at least a portion of the dataset is not loaded if the gap filter indicates that the at least one value may not be present in the dataset, thus improving computing efficiency.

2. The computing system of claim 1, wherein the gap filter indicates that the at least one value may be present in the dataset, the operations further comprising:
    analyzing the at least a portion of the dataset for the at least one value.

3. The computing system of claim 2, the operations further comprising:
    in response to the analyzing the at least a portion of the dataset for the at least one value, determining that the at least one value is present in the at least a portion of the dataset; and
    returning additional data in the dataset associated with the at least one value in response to the request.

4. The computing system of claim 1, the operations further comprising:
    compressing the gap filter.

5. The computing system of claim 4, wherein compressing the gap filter comprises applying dictionary encoding to the set of gap lengths and the identifiers indicating a number of unique values.

6. The computing system of claim 4, wherein compressing the gap filter comprises applying run length encoding to the set of gap lengths.

7. The computing system of claim 4, wherein compressing the gap filter uses a dictionary comprising values of the set of gap lengths, values of the identifiers indicating a number of unique values, and values used to indicate the use of run length encoding and a length of a respective run.

8. The computing system of claim 4, the operations further comprising:
    prior the compressing, manipulating the gap filter into a more compressible representation.

9. The computing system of claim 8, the operations further comprising, as part of manipulating the gap filter into a more compressible representation:
    removing a gap, wherein removing a gap introduces a number of false positive results for the gap filter corresponding to a length of a removed gap.

10. The computing system of claim 8, the operations further comprising, as part of the manipulating the gap filter into a more compressible representation:
    reducing a size of a gap from an initial size to a reduced size to eliminate a unique value from the set of gap lengths, where the reducing introduces a number of false positive results equal to the difference between the initial size and the reduced size.

11. The computing system of claim 8, the operations further comprising, as part of the manipulating the gap filter into a more compressible representation:
    determining that reducing a size of a gap produces, or increases, a series of gaps in the set of gaps having the same gap length; and
    reducing the size of the gap to match a gap length of a neighboring gap, wherein the reducing introduces a number of false positive results equal to a size by which the gap is reduced.

12. The computing system of claim 8, wherein the manipulating is performed using a budget corresponding to a number of false positive results produced by the gap filter, and wherein a manipulation is not performed if it would introduce a number of false positive results that exceed the budget.

13. The computing system of claim 12, the operations further comprising:
    after performing a manipulation, reducing the budget by an amount corresponding to a number of false positive results introduced by the manipulation.

14. The computing system of claim 1, wherein the request is an ad hoc relational database query.

15. The computing system of claim 1, the operations further comprising sorting the set of unique values using the sorting criteria to provide the sorted set of unique values, the sorting comprising:
for an element of the set of unique values, determining whether the element is in a sorted order in the set;
determining that the element is not in a sorted order; and
(1) determining the element would be sorted if a current offset value was added to the element; and
adding current offset value to the element; or
(2) determining that the element would not be sorted if the current offset value was added to the element;
increasing the offset value to provide an updated offset value; and
adding the updated offset value to the element.

16. The computing system of claim 1, the operations further comprising sorting the set of unique values using the sorting criteria to provide the sorted set of unique values, the sorting comprising:
for an element of the set of unique values, determining whether the element is in a sorted order if placed in a first stream of processed values of the set of unique values;
determining that the element would not be in a sorted order if placed in the first stream;
determining whether an unused stream is available; and
in response to determining that an unused stream is available, placing the element in the unused stream, the unused stream then being a second stream.

17. The computing system of claim 16, wherein the element of the set of unique values is a first element of the set of unique values, the operations further comprising:
for a second element of the set of unique values, determining whether the second element would be in a sorted order if placed in the first stream or the second stream;
determining that the second element would be in a sorted order if placed in either the first stream or in the second stream;
determining a difference between the second element and a last element of the first stream and a difference between the second element and a last element of the second stream; and
placing the second element in first stream in response to determining that the difference between the second element and the last element of the first stream is less than the difference between the second element and the last element of the second stream.

18. The computing system of claim 17, the operations further comprising:
merging the first stream and the second stream.

19. A method, implemented in a computing system comprising at least one memory and one or more hardware processor units coupled to the at least one memory; the method comprising:
receiving a set of sorted unique values in a dataset sorted according to a sorting criterion, the dataset being data stored in at least one computer-implemented data structure;
for values of the set of sorted unique values, determining a plurality of gaps between at least a portion of the values of the set of sorted unique values;
representing the set of unique values as a gap filter, the gap filter comprising: (1) a starting value of the set of sorted unique values, (2) a set of gap lengths for the plurality of gaps, wherein a gap length corresponds to a number of consecutive unique values that are represented as not present in the dataset; and (3) identifiers indicating a number of unique values that are represented as present in the dataset between a unique value corresponding to an ending value of a first gap and a starting value of a second gap;
receiving a computer-implemented data retrieval request requesting information in the dataset, the computer-implemented data retrieval request specifying at least one value;
in response to the computer-implemented data retrieval request, receiving a request to determine the at least one value may be present in the dataset;
determining from the gap filter whether the at least one value may be present in the dataset; and
when the gap filter indicates the at least one value may be present in the dataset, loading at least a portion of the dataset from the at least one computer-implemented data structure for use in processing the computer-implemented data retrieval request, wherein the at least a portion of the dataset is not loaded if the gap filter indicates that the at least one value may not be present in the dataset, thus improving computing efficiency.

20. One or more computer readable storage media comprising:
computer-executable instructions that, when executed by a computing system comprising at least one hardware processor and at least one memory coupled to the at least one hardware processor, cause the computing system to receive a set of sorted unique values in a dataset sorted according to a sorting criterion, the dataset being data stored in at least one computer-implemented data structure;
computer-executable instructions that, when executed by the computing system, cause the computing system to, for values of the set of sorted unique values, determine a plurality of gaps between at least a portion of the values of the set of sorted unique values;
computer-executable instructions that, when executed by the computing system, cause the computing system to represent the set of sorted unique values as a gap filter, the gap filter comprising: (1) a starting value of the set of unique values, (2) a set of gap lengths for the plurality of gaps, wherein a gap length corresponds to a number of consecutive unique values that are represented as not present in the dataset; and (3) identifiers indicating a number of unique values that are represented as present in the dataset between a unique value corresponding to an ending value of a first gap and a starting value of a second gap;
computer-executable instructions that, when executed by the computing system, cause the computing system to receive a computer-implemented data retrieval request requesting information in the dataset, the computer-implemented data retrieval request specifying at least one value;
computer-executable instructions that, when executed by the computing system, cause the computing system to, in response to the computer-implemented data retrieval request, receive a request to determine whether the at least one value may present in the dataset;
computer-executable instructions that, when executed by the computing system, cause the computing system to determine from the gap filter whether the at least one value may be present in the dataset; and computer-executable instructions that, when executed by the computing system, cause the computing system to, when the gap filter indicates the at least one value may be present in the dataset, load at least a portion of the dataset from the at least one computer-implemented data structure for use in processing the computer-implemented data retrieval request, wherein the at least a portion of the dataset is not loaded if the gap filter indicates that the at least one value may not be present in the dataset, thus improving computing efficiency.

* * * * *